(12) United States Patent
Yanagisawa et al.

(10) Patent No.: US 10,485,126 B2
(45) Date of Patent: Nov. 19, 2019

(54) PORTABLE ELECTRONIC APPARATUS

(71) Applicant: SEIKO EPSON CORPORATION, Tokyo (JP)

(72) Inventors: Mitsuto Yanagisawa, Matsumoto (JP); Keitaro Hashizume, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 1 day.

(21) Appl. No.: 15/689,729

(22) Filed: Aug. 29, 2017

(65) Prior Publication Data

US 2018/0070468 A1    Mar. 8, 2018

(30) Foreign Application Priority Data

Sep. 6, 2016  (JP) .................. 2016-173391
Sep. 23, 2016  (JP) .................. 2016-185202
Oct. 28, 2016  (JP) .................. 2016-211346

(51) Int. Cl.

| | |
|---|---|
| *H05K 5/06* | (2006.01) |
| *H05K 5/00* | (2006.01) |
| *G04G 9/00* | (2006.01) |
| *G04G 17/04* | (2006.01) |
| *G04G 17/06* | (2006.01) |
| *G04G 17/08* | (2006.01) |
| *G04G 21/02* | (2010.01) |
| *G04B 37/02* | (2006.01) |

(52) U.S. Cl.
CPC ............ *H05K 5/06* (2013.01); *G04G 9/0064* (2013.01); *G04G 17/04* (2013.01); *G04G 17/06* (2013.01); *G04G 17/08* (2013.01); *G04G 21/02* (2013.01); *H05K 5/0017* (2013.01); *H05K 5/0086* (2013.01); *G04B 37/02* (2013.01)

(58) Field of Classification Search
None
See application file for complete search history.

(56) References Cited

U.S. PATENT DOCUMENTS

| | | | |
|---|---|---|---|
| 7,072,247 B2 * | 7/2006 | Hiranuma ............ | G04B 19/283 368/281 |
| 8,275,327 B2 * | 9/2012 | Yi .................... | G04G 21/04 455/556.1 |
| 2015/0168995 A1 * | 6/2015 | Jeon .................... | G06F 1/1637 361/679.22 |

FOREIGN PATENT DOCUMENTS

| | | |
|---|---|---|
| JP | S56-84341 A | 7/1981 |
| JP | S62-130374 A | 6/1987 |
| JP | 2005-98990 A | 4/2005 |

* cited by examiner

*Primary Examiner* — Dimary S Lopez Cruz
(74) *Attorney, Agent, or Firm* — Oliff PLC

(57) ABSTRACT

A portable electronic apparatus (wrist apparatus) includes a case (top case and bottom case), a display section accommodated in the case, a windshield that closes an opening section of the case in such a way that the windshield overlaps with the display section in a plan view, a ring member (parting plate) that is disposed between the windshield and the display section and along the outer edge of the display section, a hygroscopic member that is disposed inside the case and in a first region (internal space) opposite the windshield with respect to the display section, and an air-flow channel (recessed section) that allows the first region to communicate with a second region (space) surrounded by the display section, the windshield, and the ring member.

7 Claims, 28 Drawing Sheets

| SAMPLE NUMBER | CROSS-SECTIONAL SHAPE |
|---|---|
| Sa1 | 82a |
| Sa2 | 82b |
| Sa3 | 82t, 82c, 82r, 82t |
| Sa4 | 82k, 82d |
| Sa5 | 82m, 82e, 82m |
| Sa6 | 82n, 82n, 82f |
| Sa7 | 82g |

FIG. 22

PORTABLE ELECTRONIC APPARATUS

CROSS-REFERENCES TO RELATED APPLICATIONS

This application claims priority to Japanese Patents Application No. 2016-173391, filed Sep. 6, 2016, No. 2016-211346, filed Oct. 28, 2016, and No. 2016-185202, filed Sep. 23, 2016, all of which are herein incorporated by reference.

BACKGROUND

1. Technical Field

The present invention relates to a portable electronic apparatus.

2. Related Art

In recent years, improvement in sensing technologies has allowed manufacturers to commercialize a large number of wristwatch-shaped activity quantity meters as an example of a portable electronic apparatus. JP-A-2005-98990 discloses, as an example of the wristwatch-shaped activity quantity meter, an electronic timepiece that is worn around a wrist or any other body site (subject) by using a band or any other component, is capable of wireless communication, and includes a display section that displays information in a digital form.

In wristwatch-shaped activity quantity meters, such as that described above, the display section and the inner surface of a windshield are fogged due to the humidity in the wristwatch-shaped activity quantity meter, the ambient temperature, and other factors, undesirably resulting in decrease in the visibility of displayed information in some cases. As countermeasures against the problem described above, JP-A-56-84341 discloses that a hygroscopic film is bonded to the inner surface of the case back. Further, JP-A-62-130374 discloses, as the casing ring in a case, a casing ring made of an ABS resin and impregnated with a highly hygroscopic resin.

In a wristwatch-shaped activity quantity meter (example of portable electronic apparatus), however, a variety of electronic parts, substrates, and other components accommodated in a case at high density cause the distance from the portion where the hygroscopic member is disposed to the windshield to increase in the hygroscopic measures described above, resulting in a long path (air-flow channel), or prevent arrangement of a path (air-flow channel) that allows sufficient air flow in some cases. In this case, since sufficient air flow between the space where the hygroscopic member is disposed and the low humidity is therefore achieved and the space that faces the windshield and where the fog phenomenon poses a problem cannot be ensured, a sufficient defogging effect cannot be provided in some cases because a sufficient amount of dry air does not spread over the space that faces the windshield.

SUMMARY

An advantage of some aspects of the invention is to solve at least a part of the problems described above, and the invention can be implemented as the following forms or application examples.

Application Example 1

A portable electronic apparatus according to this application example includes a case, a display section accommodated in the case, a windshield that closes an opening section of the case in such a way that the windshield overlaps with the display section in a plan view, a ring member that is disposed between the windshield and the display section and along an outer edge of the display section, a hygroscopic member that is disposed inside the case and in a first region opposite the windshield with respect to the display section, and an air-flow channel that allows the first region to communicate with a second region surrounded by the display section, the windshield, and the ring member.

According to this application example, the air-flow channel, which is disposed in the case and allows the first region, where the hygroscopic member is disposed, to communicate with the second region, which the windshield faces, allows air dehumidified by the hygroscopic member to spread over the second region for ventilation. As a result, the air in the second region, which faces the windshield, where a fogging phenomenon occurs, can be dehumidified, whereby the windshield can be defogged in an excellent manner.

Application Example 2

In the portable electronic apparatus described in the application example, it is preferable that the air-flow channel includes a recessed section provided in a surface that forms the ring member and faces the display section and extending from an outer circumferential edge of the ring member to an inner circumferential edge thereof.

According to this application example, the recessed section, which is provided in the display-section-surface of the ring member and extending from the outer circumferential edge of the ring member to the inner circumferential edge thereof, forms a gap between the ring member and the display section. Since the gap functions as the air-flow channel, air is allowed to flow via the outer circumferential edge of the ring member toward the inner circumferential edge thereof. Further, the recessed section, which is provided on the display-section-side surface of the ring member and cannot therefore be visually recognized through the windshield, does not degrade the exterior appearance of the portable electronic apparatus.

Application Example 3

In the portable electronic apparatus described in the application example, it is preferable that the air-flow channel includes a first hole that passes through the display section from a surface thereof facing the windshield to a surface thereof opposite the windshield-side surface.

According to this application example, the first hole, which passes through the display section from the surface thereof facing the windshield to the surface thereof opposite the windshield-side surface, allows satisfactory air flow between the first region, where the hygroscopic member is disposed, and the second region, which faces the windshield. Fogging that occurs on the windshield due to humidity can therefore be suppressed.

Application Example 4

In the portable electronic apparatus described in the application example, it is preferable that the air-flow channel includes a first recessed section that passes through the display section from a surface thereof facing the windshield to a surface thereof opposite the windshield-side surface and is recessed from an outer edge of the display section toward a center thereof.

According to this application example, the first recessed section, which is recessed inward from the outer edge of the display section, allows satisfactory air flow between the first region, where the hygroscopic member is disposed, and the second region, which faces the windshield. The effect of defogging the windshield can therefore be provided.

Application Example 5

In the portable electronic apparatus described in the application example, it is preferable that the air-flow channel includes a second hole that faces the first hole and passes through the ring member from a surface thereof facing the windshield to a surface thereof facing the display section.

According to this application example, the first hole and the second hole, which is provided in the ring member and in the position facing the first hole and forms part of the air-flow channel, allows satisfactory air flow between the first region, where the hygroscopic member is disposed, and the second region, which faces the windshield. The effect of defogging the windshield can therefore be provided.

Application Example 6

In the portable electronic apparatus described in the application example, it is preferable that the ring member has a protruding section that is located on a surface facing the display section and protrudes toward the display section, and that the air-flow channel includes a gap provided by the protruding section and located between the ring member and the display section.

According to this application example, since the gap formed by the protruding section and located between the display section and the ring member serves as the air-flow channel, air is allowed to flow via the outer circumferential edge of the ring member toward the inner circumferential edge thereof. Further, the protruding section, which is provided on the display-section-side surface of the ring member and cannot therefore be visually recognized through the windshield, does not degrade the exterior appearance of the portable electronic apparatus.

Application Example 7

In the portable electronic apparatus described in the application example, it is preferable that the ring member is a parting plate.

According to this application example, since the ring member is a parting plate, the number of constituent parts can be reduced, which contributes to reduction in cost of the apparatus and reduction in size of the apparatus.

Application Example 8

A portable electronic apparatus according to this application example includes a case, a display section accommodated in the case, a substrate that closes an opening section of the case in such a way that the substrate overlaps with the display section in a plan view, and an annular seal member so disposed along an outer edge of the display section as to seal a space between the substrate and the display section.

In the portable electronic apparatus according to this application example, since the seal member can seal the space formed by the substrate and the display section, the interposed sealed space can reduce the difference between the outside temperature and the temperature in the case. Occurrence of fogging on the substrate due to dew condensation resulting from a change in the outside temperature can therefore be suppressed.

Application Example 9

It is preferable that The portable electronic apparatus according to the application example further includes a parting plate disposed between the substrate and the display section and along the outer edge of the display section, and the annular seal member is formed of a first annular member and a second annular member, the first annular member is disposed between the substrate and a surface that forms the parting plate and faces the substrate, and the second annular member is disposed between the display section and a surface that forms the parting plate and faces the display section.

In the portable electronic apparatus according to this application example, since the space formed by the substrate, the parting plate disposed along the outer edge of the display section and the display section is sealed by the first annular member, which is an annular seal member and disposed between the substrate and the parting plate, and the second annular member, which is a seal member and disposed between the parting plate and the display section, the interposed sealed space can reduce the difference between the outside temperature and the temperature in the case. Occurrence of fogging on the substrate due to dew condensation resulting from a change in the outside temperature can therefore be suppressed.

Application Example 10

In the portable electronic apparatus according to the application example, it is preferable that a recess is provided in at least one of a surface which forms the annular seal member and to which the substrate is in contact and a surface which forms the annular seal member and with which the display section is in contact.

In the portable electronic apparatus according to this application example, since a recess is provided in at least one of a surface which forms the annular seal member and to which the substrate is in contact and a surface which forms the annular seal member and with which the display section is in contact, the seal member can increase the degree of intimate contact between the seal member and the substrate and between the seal member and the display section and therefore improve the airtightness of the space formed by the substrate and the display section.

Application Example 11

In the portable electronic apparatus according to the application example, it is preferable that the annular seal member is a parting plate.

According to the portable electronic apparatus of this application example, the annular seal member is formed as the parting plate and so colored that the color tone of the parting plate differs from that of the case, whereby the exterior appearance of the portable electronic apparatus can be improved.

Application Example 12

In the portable electronic apparatus according to the application example, it is preferable that a recess is provided in at least one of the substrate and the display section with which the annular seal member is in contact and in portions where the contact occurs.

According to the portable electronic apparatus of this application example, since a recess is provided in at least one of the substrate and the display section with which the annular seal member is in contact and in the portions where the contact occurs, the annular seal member can be stably held, whereby the degree of intimate contact between the seal member and the substrate or the display section can be improved.

Application Example 13

In the portable electronic apparatus according to the application example, it is preferable that the space is filled with an inert gas or the space has a reduced-pressure atmosphere.

According to the portable electronic apparatus of this application example, since the space formed by the substrate, the seal member, and the display section is filled with an inert gas, such as nitrogen, helium, and argon, the humidity (the amount of moisture) in the sealed space can be reduced to a small value. Occurrence of fogging on the substrate due to dew condensation resulting from a change in the outside temperature can therefore be suppressed. The humidity (the amount of moisture) in the sealed space can also be reduced to a small value by achieving a reduced-pressure or semi-vacuum atmosphere (state in which degree of vacuum is high) in the space formed by the substrate, the seal member, and the display section. Occurrence of fogging on the substrate due to dew condensation resulting from a change in the outside temperature can therefore be suppressed.

Application Example 14

A portable electronic apparatus according to this application example includes a case, a windshield that closes an opening section of the case, a display section accommodated in the case and so disposed as to overlap with the windshield in a plan view with a first space sandwiched between the display section and the windshield, and a frame provided with a recessed concave section that opens toward the windshield and has an inner bottom surface to which the display section is attached to via a circumferential first seal member. The frame divides an internal space of the case into the first space and a second space provided on a side opposite the first space via the display section and the frame, and the frame is so attached to the case by an annular second seal member in such a way that the first space is a sealed space.

According to this application example, since the frame to which the display section is attached via the first seal member is attached to the case via the annular second seal member, the first space between the windshield and the display section is sealed. As a result, since the first space is isolated from the second space, in which the temperature is relatively higher than in the first space, a situation in which the difference in temperature between the spaces outside and inside the windshield rapidly increases can be avoided, whereby dew condensation (fogging) that occurs on the inner surface of the windshield can be suppressed.

Application Example 15

In the portable electronic apparatus described in the application example, it is preferable that the second seam member is disposed on an outer side surface of a wall section provided along a circumference of the recessed concave section.

According to this application example, providing the annular second seal member between the outer side surface of the wall section of the frame and the case allows the frame to be connected to the case with the space between the outer side surface of the wall section of the frame and the case sealed.

Application Example 16

In the portable electronic apparatus described in the application example, it is preferable that the second seam member is disposed on a surface that forms a wall section provided along a circumference of the recessed concave section and faces the windshield.

According to this application example, interposing the annular second seal member between the windshield-side surface of the wall section of the frame and the case allows the windshield to be connected to the case with the space between the windshield-side surface of the wall section of the frame and the case sealed.

Application Example 17

In the portable electronic apparatus described in this application example, it is preferable that the second seal member is an elastic member having at least one of waterproofness and gas barrier capability, and that the second seal member has a circular, oval, or elliptical cross-sectional shape.

According to this application example, the annular second seal member formed of an elastic member having at least one of waterproofness and gas barrier capability prevents entry of moisture (water, water vapor) into the space formed by the windshield and the display section, whereby a fogging phenomenon due to dew condensation that occurs on the windshield resulting, for example, from a change in outside temperature can be suppressed. Further, the circular, oval, or elliptical cross-sectional shape of the second seal member allows an increase in the degree of intimate contact between the second seal member and the case and between the second seal member and the frame, whereby the airtightness of the second space between the windshield and the display section can be improved.

Application Example 18

In the portable electronic apparatus described in the application example, it is preferable that the second seal member has a recessed section provided in at least one of a surface that in contact with the case and a surface that is in contact with the frame.

According to this application example, a recessed section provided in at least one of the surface of the second seal member that is in contact with the case and the surface of the second seal member that is in contact with the frame allows a decrease in the area of the contact portion of the second seal member, whereby the degree of intimate contact between the case or the frame and the second seal member can be increased, and the degree of airtightness can therefore be improved.

Application Example 19

In the portable electronic apparatus described in the application example, it is preferable that the second seal member has a polygonal cross-sectional shape.

According to this application example, the second seal member can be stably placed, whereby the degree of intimate contact of the second seal member can be increased, and the degree of airtightness of the space formed by the windshield and the display section can be increased accordingly.

Application Example 20

In the portable electronic apparatus described in the application example, it is preferable that a recess is provided in at least one of the case and the frame and in a portion that is in contact with the second seal member.

According to this application example, since a recess is provided in at least one of the case and the frame and in a portion that is in contact with the second seal member, the second seal member can be stably held, whereby the degree of intimate contact between the second seal member and the case or the frame can be improved.

Application Example 21

In the portable electronic apparatus described in the application example 3 or 4 described above, it is preferable that the air-flow channel includes a second recessed section that passes through the ring member from a surface thereof facing the windshield to a surface thereof opposite the windshield-side surface and is recessed from an outer circumferential edge of the ring member toward a center thereof.

According to this application example, the second recessed section, which passes through the windshield-side surface of the ring member to the surface thereof opposite the windshield-side surface and is recessed inward from the outer circumferential edge of the ring member, allows satisfactory air flow between the first region, where the hygroscopic member is disposed, and the second region, which faces the windshield. The effect of defogging the windshield can therefore be provided.

Application Example 22

In the portable electronic apparatus described in any of the application examples 3 to 5 and 21 described above, it is preferable that a circuit substrate is so disposed in the first region as to overlap with the display section in the plan view, that the hygroscopic member is disposed on the side opposite the display section with respect to the circuit substrate, and that the air-flow channel includes a third hole that faces the first hole and passes from the display-section-side surface of the circuit substrate to the surface thereof opposite the display-section-side surface.

According to this application example, the third hole, which is provided in the circuit substrate and in the position facing the first hole and is part of the air-flow channel, and the first hole allow satisfactory air flow between the first region, where the hygroscopic member is disposed, and the second region, which faces the windshield. The effect of defogging the windshield can therefore be provided.

Application Example 23

In the portable electronic apparatus described in any of the application examples 3 to 5 and 21 described above, it is preferable that a circuit substrate is so disposed in the first region as to overlap with the display section in the plan view, that the hygroscopic member is disposed on the side opposite the display section with respect to the circuit substrate, and that a third hole that passes from the display-section-side surface of the circuit substrate to the surface thereof opposite the display-section-side surface and is recessed from an outer circumferential edge of the circuit substrate toward a center thereof is provided.

According to this application example, the third hole, which passes from the display-section-side surface of the circuit substrate to the surface thereof opposite the display-section-side surface and is recessed from the outer circumferential edge of the circuit substrate toward the center thereof, allows satisfactory air flow between the first region, where the hygroscopic member is disposed on the side opposite the display-section side of the circuit substrate so disposed as to overlap with the display section in the plan view, and the second region, which faces the windshield. The effect of defogging the windshield can therefore be provided.

Application Example 24

In the portable electronic apparatus according to the application example 8 or 9 described above, the annual seal member may be an elastic member having waterproofness.

According to this electronic apparatus of this application example, the annual seal member formed of an elastic member having waterproofness prevents entry of moisture into the space formed by the substrate and the display section, whereby fogging due to dew condensation that occurs on the substrate resulting from a change in outside temperature can be suppressed.

Application Example 25

In the portable electronic apparatus according to any of the application examples 8, 9, and 24 described above, the annular seal member may have a circular or elliptical cross-sectional shape.

According to the portable electronic apparatus of this application example, since the annular seal member has a circular or elliptical cross-sectional shape, the seal member can increase the degree of intimate contact between the seal member and the substrate and between the seal member and the display section, whereby the airtightness of the space formed by the substrate and the display section can be improved.

Application Example 26

In the portable electronic apparatus according to any of the application examples 8, 9, and 24 described above, the annular seal member may have a trapezoidal cross-sectional shape.

According to the portable electronic apparatus of this application example, the annular seal member has a trapezoidal cross-sectional shape, whereby the degree of intimate contact of the seal member can be increased, and the degree of airtightness of the space formed by the substrate and the display section can be improved accordingly.

Application Example 27

In the portable electronic apparatus according to any of the application examples 8 to 12 and 24 to 26 described above, the space may be filled with an inert gas.

According to the portable electronic apparatus of this application example, since the space formed by the substrate, the seal member, and the display section is filled with an inert gas, such as nitrogen, helium, and argon, the humidity (the amount of moisture) in the sealed space can be reduced to a small value. Occurrence of fogging on the substrate due to dew condensation resulting from a change in the outside temperature can therefore be suppressed.

Application Example 28

In the portable electronic apparatus according to any of the application examples 8 to 12 and 24 to 26 described above, the space may have a reduced-pressure atmosphere.

According to the portable electronic apparatus of this application example, the humidity (the amount of moisture) in the sealed space can be reduced to a small value by achieving a reduced-pressure or semi-vacuum atmosphere (state in which degree of vacuum is high) in the space formed by the substrate, the seal member, and the display section. Occurrence of fogging on the substrate due to dew condensation resulting from a change in the outside temperature can therefore be suppressed.

Application Example 29

In the portable electronic apparatus described in any of the application examples 14 to 16 described above, it is preferable that the second seal member is an elastic member having at least one of waterproofness and gas barrier capability.

According to this application example, the second seal member formed of an elastic member having waterproofness and gas barrier capability prevents entry of moisture (water, water vapor) into the space formed by the windshield and the display section, whereby a fogging phenomenon due to dew condensation that occurs on the windshield resulting, for example, from a change in outside temperature can be suppressed.

Application Example 30

In the portable electronic apparatus described in any of the application examples 14 to 16 described above, it is preferable that the second seal member has a circular, oval, or elliptical cross-sectional shape.

According to this application example, the second seal member having a circular, oval, or elliptical cross-sectional shape can increase the degree of intimate contact between the second seal member and the case and between the second seal member and the frame, whereby the airtightness of the second space formed by the windshield and the display section can be improved.

Application Example 31

In the portable electronic apparatus described in the application example 19 described above, it is preferable that the second seal member has a trapezoidal cross-sectional shape.

According to this application example, the second seal member can be stably disposed, and the degree of intimate contact of the second seal member and hence the degree of airtightness of the space formed by the windshield and the display section can be increased.

BRIEF DESCRIPTION OF THE DRAWINGS

The invention will be described with reference to the accompanying drawings, wherein like numbers reference like elements.

FIG. 22 is a table that lists variations of the cross-sectional shape of the second seal member.

DESCRIPTION OF EXEMPLARY EMBODIMENTS

Figure 1:
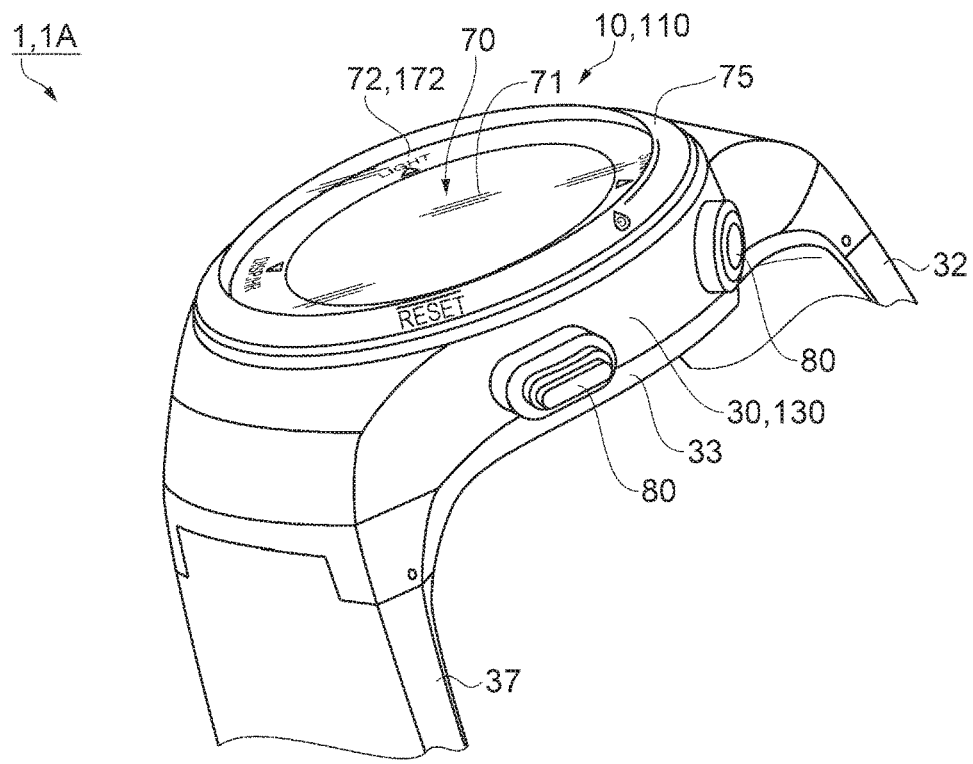
FIG. 1 is a front-side perspective view of a wrist apparatus according to first to seventh embodiments of a portable electronic apparatus.

Embodiments of the invention will be described below. It is not intended that the present embodiments described below unduly limit the contents of the invention set forth in the appended claims. Further, all configurations described in the present embodiments are not necessarily essential configuration requirements of the invention.

In the following description relating to the embodiments will be made primarily of different forms and configurations, and similar forms and configurations have the same reference characters and will not be described in some cases.

In the present specification, the following embodiments are described in some cases on the assumption that the side facing a windshield of a wrist apparatus represents the front (front side) and the side opposite the windshield (side that is in contact with user when user wears wrist apparatus) is the rear (rear side) for convenience of the description. The wrist apparatus according to the following embodiments can be a wide variety of watches, for example, a runner's watch, a multi-sport-supporting runner's watch, such as watches for duathlon and triathlon, and a GPS watch that incorporates a GPS device as the global navigation satellite system.

First Embodiment

Figure 2:
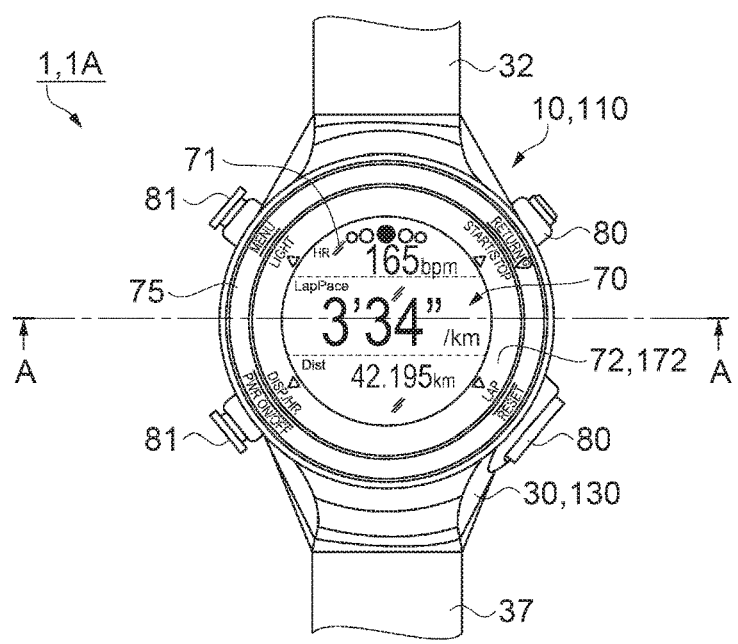
FIG. 2 is a plan view of the wrist apparatus according to the first to seventh embodiments.

An overview of a wrist apparatus according to a first embodiment of a portable electronic apparatus of an aspect of the invention will first be described with reference to FIGS. 1 and 2. FIG. 1 is a front-side perspective view of a wrist apparatus according to first to seventh embodiments of the portable electronic apparatus. FIG. 2 is a plan view of the wrist apparatus according to the first to seventh embodiments.

As shown in FIGS. 1 and 2, a wrist apparatus 1 or a wrist apparatus 1A, the latter of which will be described later, as an example of a portable (wearable) electronic apparatus is worn on a user's (wearer's) given site (wrist, for example) and capable of detecting information on the user's position, the user's motion, and the user's other parameters. The wrist apparatus 1 and 1A can also be provided, for example, with the function of detecting biological information, such as pulse wave information, and the function of acquiring time information and other pieces of information as well as the function of acquiring information on the user's position and motion.

The wrist apparatus 1 according to the first embodiment includes an apparatus body 10, which is worn on the user and detects position information, motion information, and other pieces of information, and a first band section 32 and a second band section 37, which are attached to the apparatus body 10 and allows the user to wear the apparatus body 10.

The apparatus body 10 is so configured that a bottom case 33 is disposed on the side where the wrist apparatus 1 is worn on the user and a top case 30 having an opening section 40 (see FIG. 3), which opens frontward, is disposed on the side opposite the side where the wrist apparatus 1 is worn on the user. The bottom case 33 and the top case 30 form a case. A bezel 75 is provided outside the opening section 40, which is located on the front side of the apparatus body 10 (top case 30), and a windshield (glass plate in the present example) 71, which serves as a top plate portion (outer wall) that protects the internal structure of the apparatus body 10, is so provided inside the bezel 75 as to line up with the bezel 75. The windshield 71 is so disposed as to overlap with a display section 70, which will be described later, in a plan view and close the opening section 40 of the top case 30. A plurality of buttons 80 and 81 are provided on the side surface of the front side (top case 30) of the apparatus body 10. The bezel 75 can be provided with displayed information visually recognizable from the front side.

The apparatus body 10 further includes the display section 70, which is disposed immediately below the windshield 71 and formed, for example, of a liquid crystal display (LCD), and a parting plate 72 as a ring member, which is disposed between an outer edge portion of the windshield 71 and the display section 70. The parting plate 72 can be provided with displayed information visually recognizable from the front side. The apparatus body 10 may be so configured that the user can view the displayed information on the display section 70 and the displayed information on the parting plate 72 via the windshield 71. That is, in the wrist apparatus 1 according to the present embodiment, detected position information, motion information, time information, or a variety of other pieces of information may be displayed in the display section 70, and the displayed information on the front side of the apparatus body 10 may be presented to the user. Further, a pair of band attaching portions (not shown) that are portions to be connected to the first band section 32 and the second band section 37 are provided on opposite sides of the bottom case 33.

Figure 4:
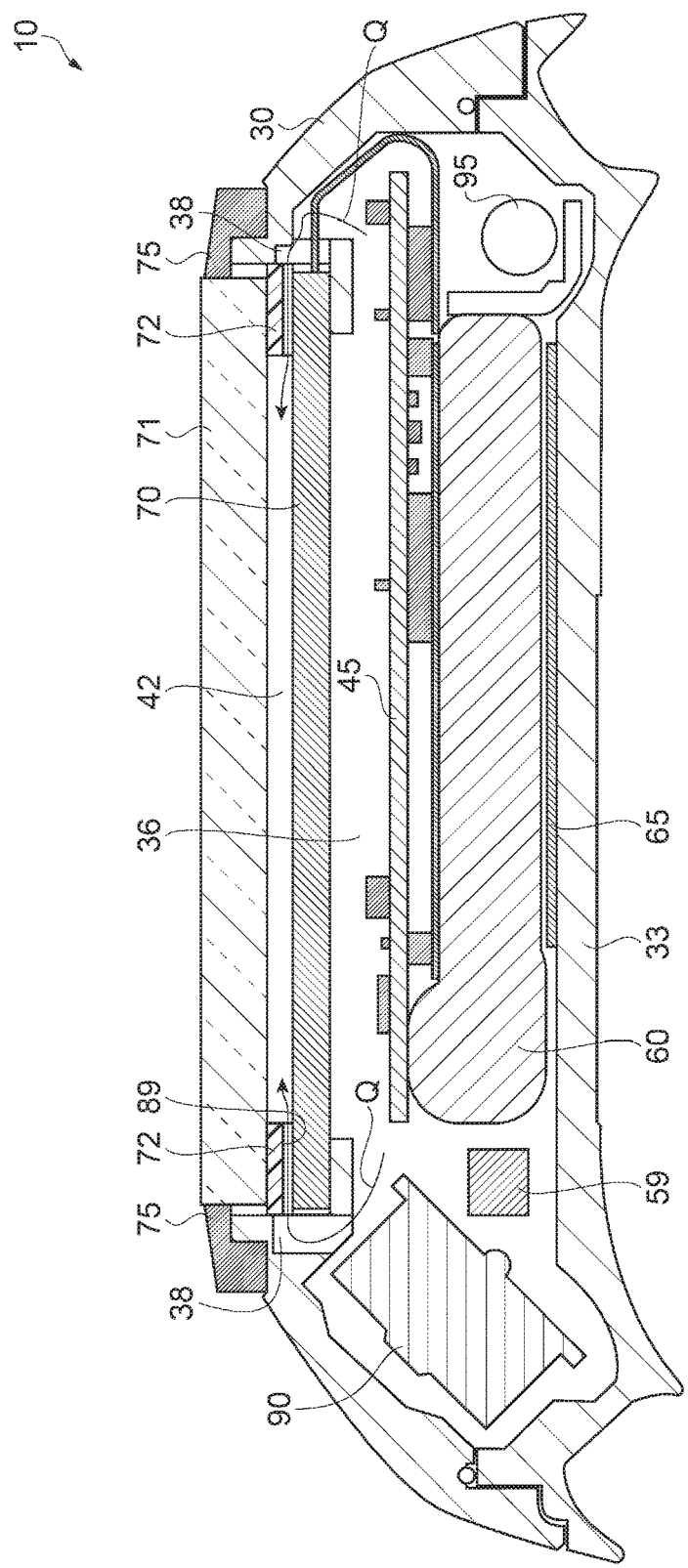
FIG. 4 is a cross-sectional view taken along the line A-A in FIG. 2 and showing the schematic configuration of the wrist apparatus according to the first embodiment.

The windshield 71 in the top plate portion of the apparatus body 10 is not limited to a glass plate but can be a member made, for example, of a transparent plastic material other than a glass material as long as the member is a transparent member that allows the user to view the display section 70 and has strength large enough to protect the liquid crystal display (LCD) and other constituent members that form the display section 70 accommodated in the interior formed by the top case 30 and the bottom case 33 (internal space 36 shown in FIG. 4).

Figure 3:
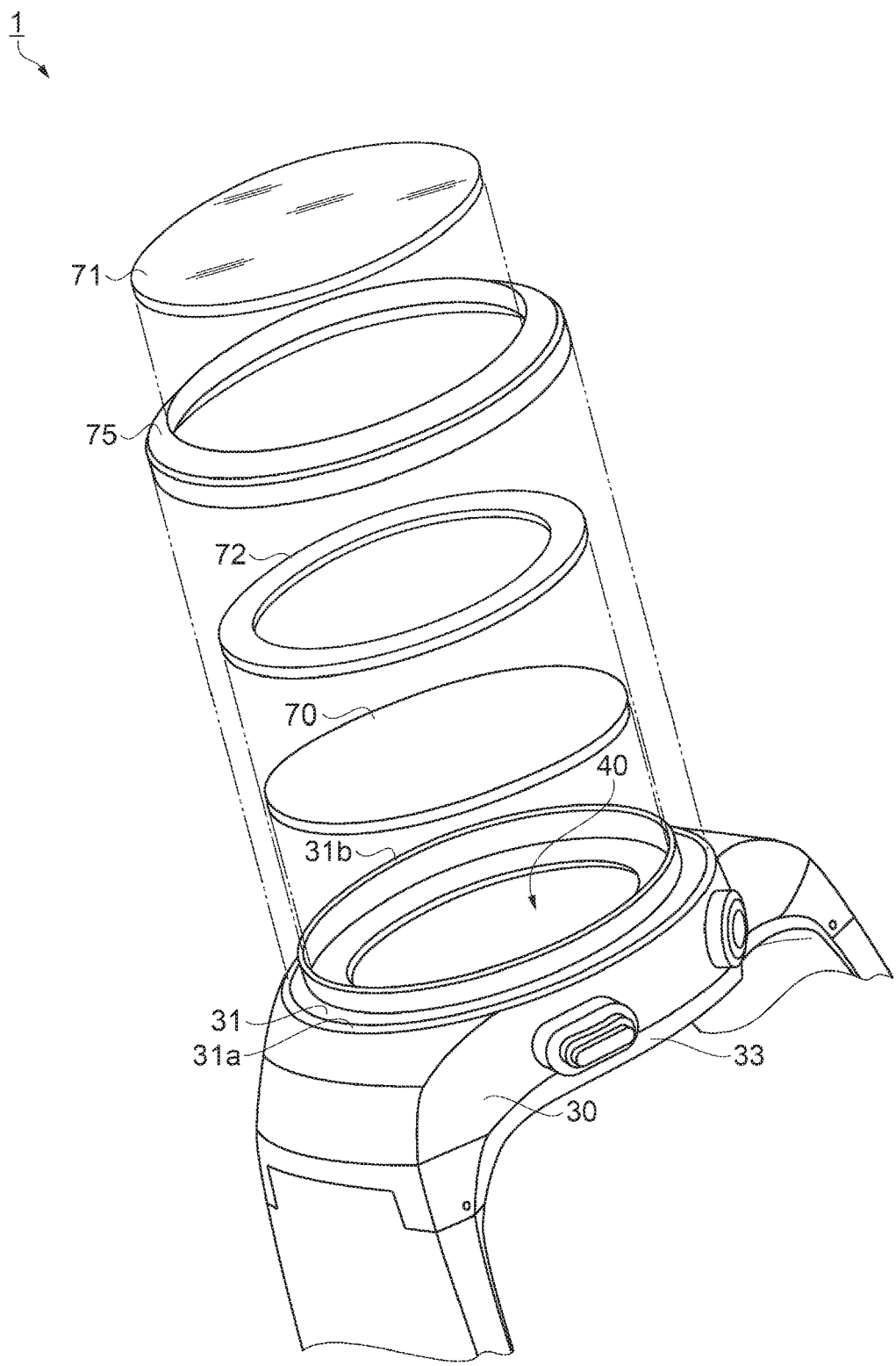
FIG. 3 is an exploded perspective view showing a schematic configuration of the wrist apparatus according to the first embodiment.
Figure 5:
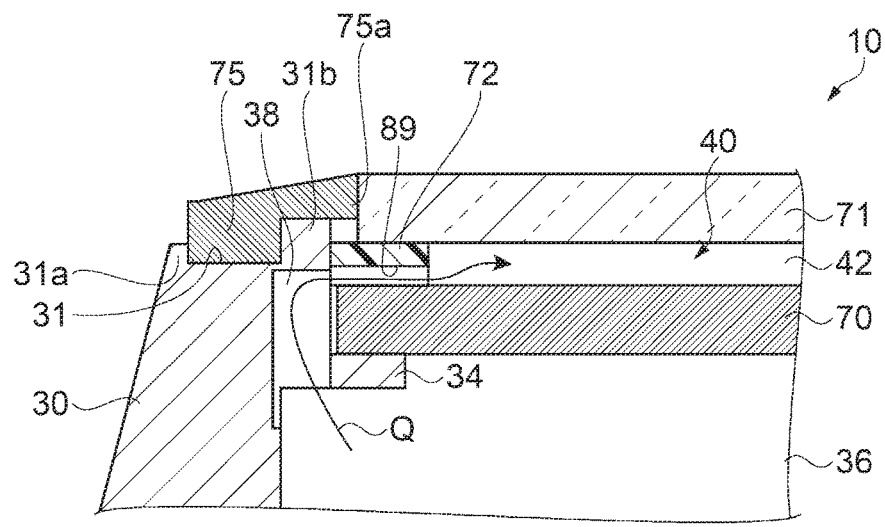
FIG. 5 is a partially enlarged view of FIG. 4.

An example of the configuration of the cross-sectional structure of the apparatus body 10 will next be described with reference to FIGS. 3, 4, and 5. FIG. 3 is an exploded perspective view showing a schematic configuration of the wrist apparatus according to the first embodiment. FIG. 4 is a cross-sectional view taken along the line A-A in FIG. 2 and showing the schematic configuration of the wrist apparatus according to the first embodiment. FIG. 5 is a partially enlarged view of FIG. 4 and shows the schematic configuration of the wrist apparatus according to the first embodiment.

The apparatus body 10 is provided with an internal space 36 (first region), which is a sealed space present inside the case and surrounded by the top case 30, the bottom case 33, and the windshield 71, which closes the opening section 40 of the top case 30, as shown in FIGS. 3, 4, and 5. The internal space 36 accommodates the display section 70, the parting plate 72, and the element parts that form the wrist apparatus 1, for example, a circuit substrate 45, a GPS (global positioning system) antenna 90, a geomagnetism sensor 59 as an example of a sensor, a secondary battery 60, and a vibrator 95. Further, a sheet-shaped hygroscopic member 65 is disposed in the internal space 36 inside the bottom case 33, as shown in FIG. 4. The apparatus body 10 does not necessarily have the configuration shown in FIG. 4, and other sensors, for example, a barometric sensor, and other electronic parts may be added.

In the apparatus body 10, the display section 70 is placed on the front side (side facing windshield 71) of a projecting section 34, which projects inward in the top case 30, as shown in FIG. 5. The parting plate 72 is then placed on the front side (side facing windshield 71) of the display section 70 and along a second wall section 31b, which is provided as part of the top case 30 and will be described later. In other words, the parting plate 72 is disposed between the windshield 71 and the display section 70 and along the outer edge of the display section 70. The arrangement described above provides, as a second region surrounded by the display section 70, the windshield 71, and the parting plate 72, a space 42, which is separate from the internal space 36 as the first region.

The liquid crystal display (LCD), which forms the display section 70, displays, for example, position information obtained by using the GPS and the geomagnetism sensor 59, motion information, such as the travel and the amount of motion, that latter of which is obtained by using an angular velocity sensor, an acceleration sensor, or any other sensor, biological information, such as the pulse rate, obtained by using a pulse wave sensor or any other sensor, and time information, such as current time. The user can view (visually recognize) the displayed pieces of information through the windshield 71.

The apparatus body 10 further includes a circumferential recessed section 31, which is located on the side facing the outer edge of the top case 30 and opens toward the front side, as shown in FIGS. 3, 4, and 5. Wall sections are formed along the outer and inner circumferences of the recessed section 31 and formed of a first wall section 31a, provided along the outer circumference and a second wall section 31b provided along the inner circumference. At least part of the bezel 75 is inserted into and fixed to the recessed section 31. Inserting the bezel 75 into the recessed section 31 as described above readily allows positioning of the bezel 75 with respect to the top case 30.

The bezel 75 has an overhanging section 75a, which overhangs toward the windshield 71. The overhanging section 75a may be in contact with the top of the second wall section 31b along the inner circumference of the top case 30. Causing the overhanging section 75a to be in contact with the top of the second wall section 31b of the top case 30 allows decrease in deformation of the overhanging section 75a. The bezel 75 may be made, for example, of stainless steel or brass (copper-zinc alloy) with the surface of the bezel 75 plated.

The windshield 71 is so disposed on the side facing the inner circumferential surface (inner side surface) of the overhanging section 75a of the bezel 75 as to line up with the bezel 75. The windshield 71 is so disposed as to be in contact with the inner side surface of the overhanging section 75a of the bezel 75. The windshield 71 is so held by the bezel 75 as not to fall off the apparatus body 10 (top case 30). In the present embodiment, the windshield 71 and the parting plate 72 are so disposed as to be in contact with each other, but a gap may be provided between the windshield 71 and the parting plate 72.

The sheet-shaped hygroscopic member 65, which is disposed in the internal space 36 as the first region, can be made, for example, of a material containing polyacrylate fibers. The hygroscopic member 65 can be formed, for example, of a sheet-shaped thin plate having a thickness t of about 2.0 mm and containing polyacrylate fibers. The thus configured hygroscopic member 65 can absorb damp (moisture) in the region where the hygroscopic member 65 is disposed (internal space 36 and space 42, into the latter of which air flows) and can therefore lower the humidity in the area where the hygroscopic member 65 is disposed to a value at which dew condensation is unlikely to occur. Since the region where the hygroscopic member 65 is disposed is a sealed region (internal space 36 and space 42, into the latter of which air flows), the humidity at which dew condensation is unlikely to occur can be maintained.

Figure 6:
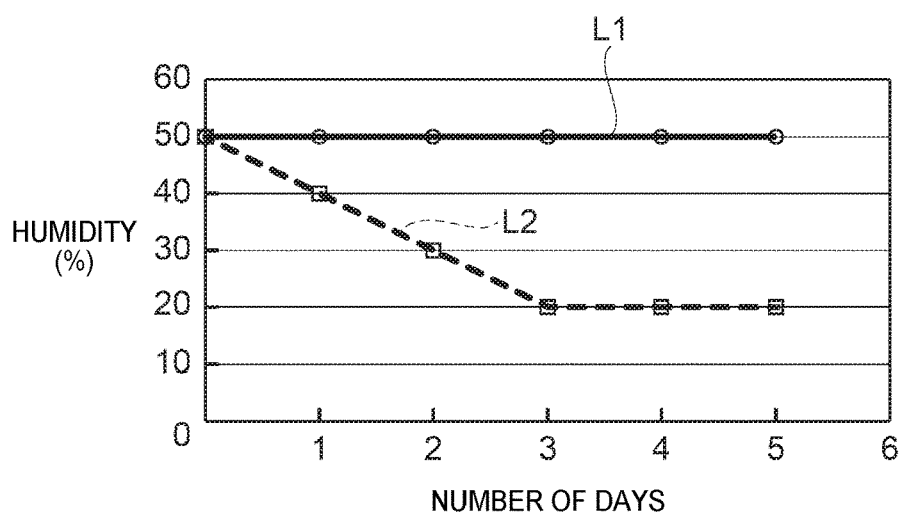
FIG. 6 show graphs illustrating a hygroscopic effect provided by a hygroscopic member.

FIG. 6 shows graphs illustrating results of examination of the hygroscopic effect provided by the hygroscopic member 65. FIG. 6 show graphs illustrating the hygroscopic effect provided by the hygroscopic member. In FIG. 6, the solid-line graph L1 shows a change in the humidity in a state in which no hygroscopic thin plate is present in a sealed space (constant or no change), and the chain-line graph L2 shows a change in the humidity in a state in which a hygroscopic thin plate is introduced in the sealed space.

Specifically, FIG. 6 shows results obtained in a case where a hygroscopic thin plate having a volume of about 45 $mm^3$ and containing polyacrylate fibers was introduced into a sealed space having a volume of about 17 ml, and the resultant changes in the humidity in the space are plotted in the course of time. The volume of about 17 ml of the sealed space was so set as to be equal to the volume of the internal space 36 surrounded by the top case 30, the bottom case 33, and the windshield 71 in the present embodiment.

As seen from the graphs in FIG. 6, after the hygroscopic thin plate was introduced, the humidity gradually decreased with time and reached a humidity of 20% three days after the introduction, and the humidity was maintained at 20% afterward. It is believed that dew condensation is unlikely to occur under the condition where the humidity is 30% or lower, and occurrence of dew condensation can be sufficiently suppressed as long as a humidity of about 20% can be maintained, as indicated by the results of the examination.

Figure 7A:
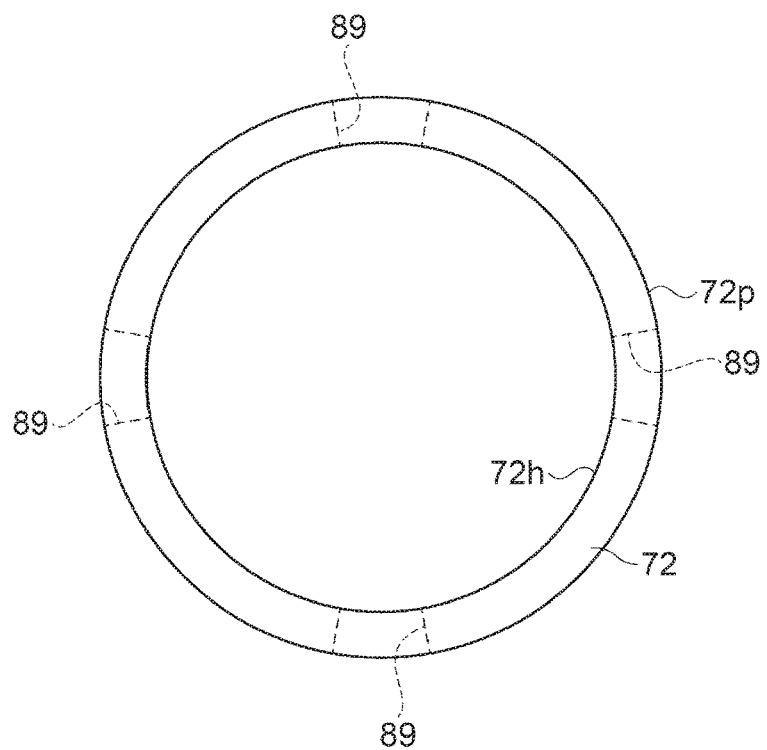
FIG. 7A is a plan view showing a parting plate of the wrist apparatus according to the first embodiment.

The parting plate 72, which forms an airflow channel that allows the internal space 36 as the first region to communicate with the space 42 as the second region, will now be described with reference to FIGS. 7A and 7B. FIG. 7A is a plan view showing the parting plate of the wrist apparatus according to the first embodiment, and FIG. 7B is a front cross-sectional view showing the parting plate.

Figure 7B:
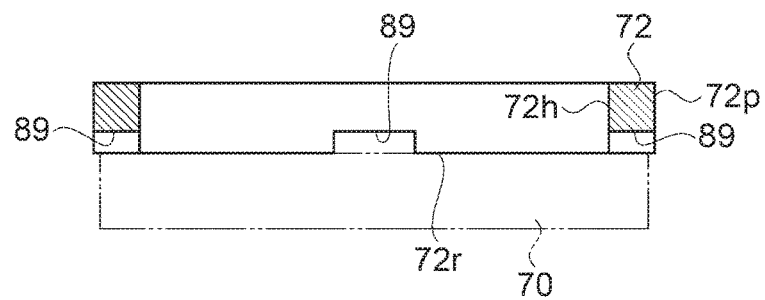
FIG. 7B is a front cross-sectional view of the parting plate.

The parting plate 72 as a ring member is a ring-shaped plate member, as shown in FIGS. 7A and 7B. The parting plate 72 is provided with four recessed sections 89, which are arranged at equal intervals and each of which serves as an air-flow channel that allows the internal space 36 as the first region to communicate with the space 42 as the second region. The recessed sections 89 are formed in a rear-side (side facing display section 70) surface 72r of the parting plate 72 and so provided as to extend from an outer circumferential edge (outer edge) 72p of the parting plate 72 to an inner circumferential edge 72h thereof.

The outer circumferential edge 72p of the parting plate 72 faces the internal space 36 as the first region, and the inner circumferential edge 72h of the parting plate 72 faces the space 42 as the second region. The recessed sections 89 can therefore function as air-flow channels that allow the internal space 36 as the first region to communicate with the space 42 as the second region, as shown in FIGS. 4 and 5. The recessed sections 89 link the internal space 36 to the space 42 via a clearance 38 as an air-flow channel between the outer edge of the display section 70 and the top case 30. As a result, air flows along the arrow Q in FIGS. 4 and 5, whereby air flow between the internal space 36 and the space 42 can be achieved.

The parting plate 72 can be made, for example, of stainless steel, aluminum, or brass (copper-zinc alloy) with the surface of the parting plate 72 plated. The parting plate 72 can, for example, be a resin member primarily made of an epoxy resin or an elastic member that functions as a buffer member and a gasket (seal member).

In the present embodiment, the configuration in which the four recessed sections 89 are arranged at equal intervals is presented by way of example, but the arrangement of the recessed sections 89 and the number thereof are not limited to those described above and may be any arrangement and any number. Further, the recessed sections 89 may be recesses produced, for example, by engraving the parting plate 72 or may be members separate from the parting plate 72 and having protruding sections and recessed sections.

In the portable electronic apparatus according to the first embodiment described above, the recessed sections 89 of the parting plate 72, which form the air-flow channels that allow the first region (internal space 36), in which the hygroscopic member 65 is disposed, to communicate with the second region (space 42), which the windshield 71 faces, in the space inside the case (top case 30 and the bottom case 33), allow air dehumidified by the hygroscopic member 65 to spread over the second region (space 42) for ventilation. As a result, the air in the second region (space 42), which faces the windshield 71, where the fogging phenomenon occurs, can be dehumidified, whereby the windshield 71 can be defogged in an excellent manner.

Variations of Parting Plate

Figure 8A:
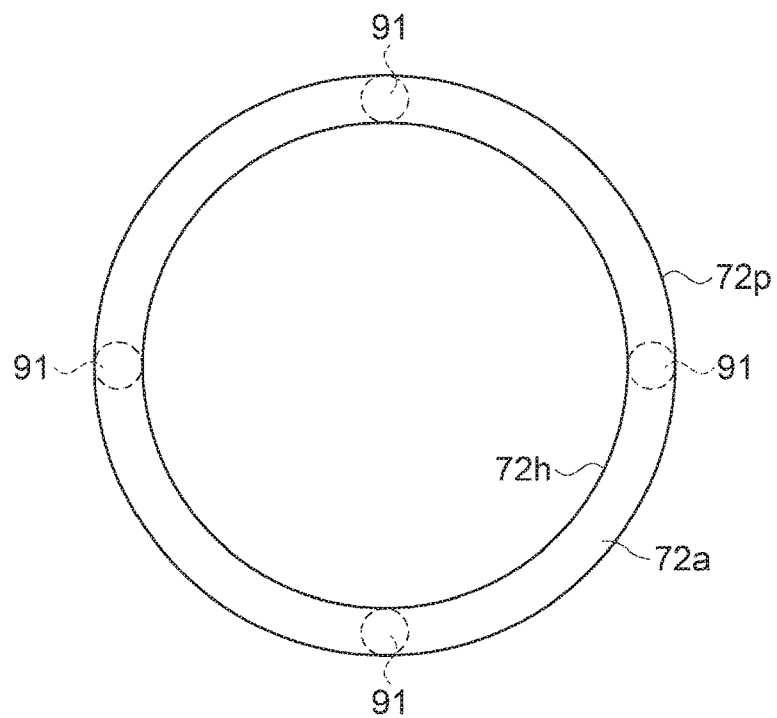
FIG. 8A is a plan view showing Variation 1 of the parting plate.
Figure 8B:
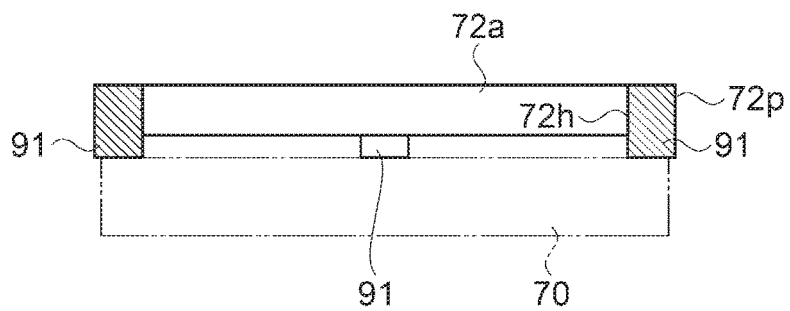
FIG. 8B is a front cross-sectional view of Variation 1 of the parting plate.
Figure 9A:
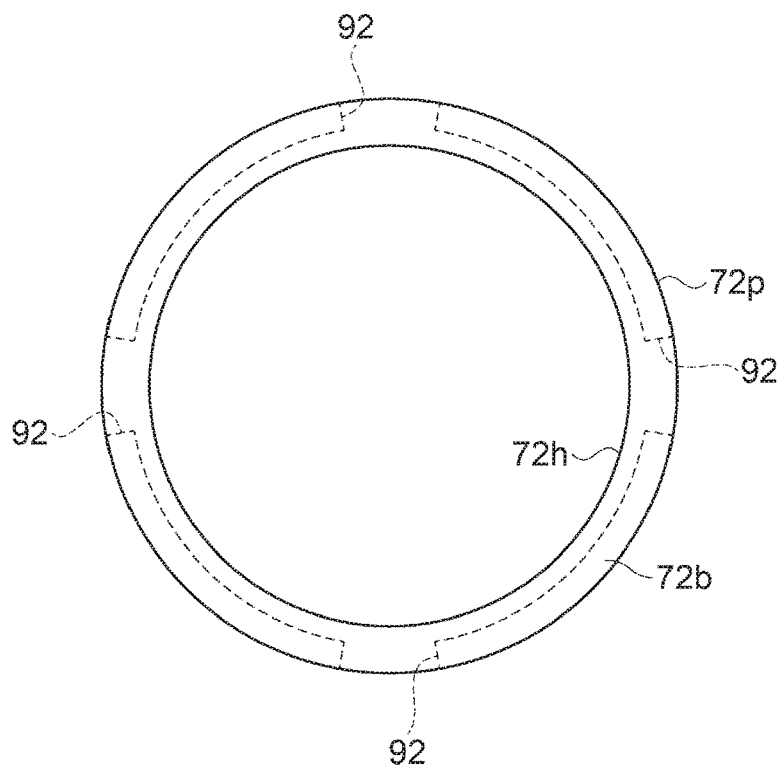
FIG. 9A is a plan view showing Variation 2 of the parting plate.
Figure 9B:
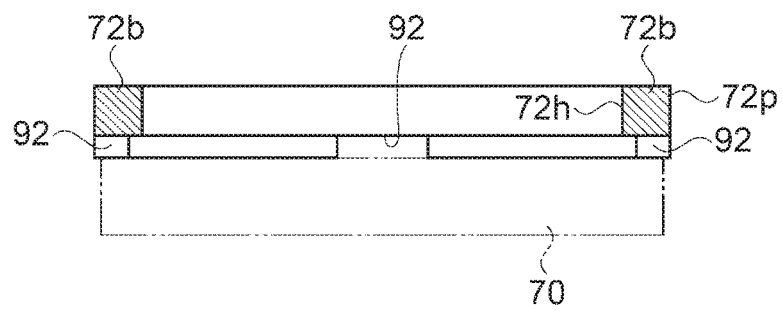
FIG. 9B is a front cross-sectional view of Variation 2 of the parting plate.
Figure 10:
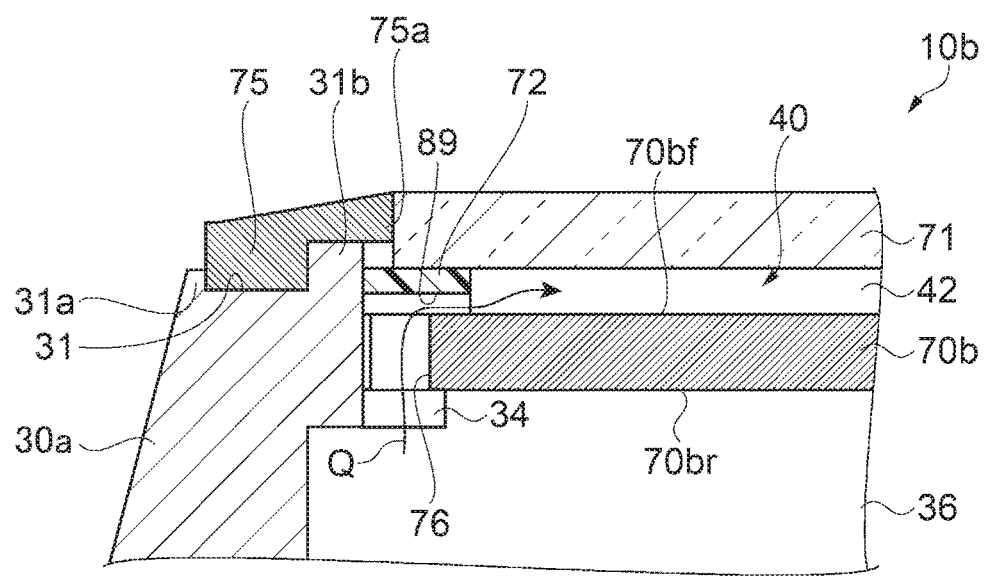
FIG. 10 shows Variation 3 of the parting plate and is a partially enlarged view corresponding to FIG. 5.

The air-flow channels provided in the parting plate 72 can be configured as shown in the following Variations 1 to 3, which will be described below with reference to FIGS. 8A, 8B, 9A, 9B, and 10. FIG. 8A is a plan view showing Variation 1 of the parting plate. FIG. 8B is a front cross-sectional view showing the parting plate according to Variation 1. FIG. 9A is a plan view showing Variation 2 of the parting plate. FIG. 9B is a front cross-sectional view showing the parting plate according to Variation 2. FIG. 10 shows Variation 3 of the parting plate and is a partially enlarged view corresponding to FIG. 5.

A parting plate 72a according to Variation 1 will first be described with reference to FIGS. 8A and 8B. The parting plate 72a according to Variation 1 is a ring-shaped plate member and has a plurality (four in the present form) protruding sections 91 arranged at equal intervals on the side facing the display section 70. The four protruding sections 91 can form gaps between the display section 70 and the parting plate 72a. The gaps function as air-flow channels that allow the internal space 36 as the first region to communicate with the space 42 as the second region.

In the present Variation 1, the configuration in which the four protruding sections 91 are arranged at equal intervals is presented by way of example, but the shape and arrangement of the protruding sections 91 and the number thereof are not limited to those described above, and any shape, arrangement, and number of protruding sections 91 may be employed. Further, the protruding sections 91 may be integrated with the parting plate 72a or may be configured as spacers that are separate from the parting plate 72a.

A parting plate 72b according to Variation 2 will next be described with reference to FIGS. 9A and 9B. The parting plate 72b according to Variation 2 is a ring-shaped plate member. The parting plate 72b is provided with four protrusion-shaped sections (protruding sections) 92 located on the side facing the display section 70, arranged at equal intervals, and extending along the outer circumferential edge 72p of the parting plate 72b to form elongated protrusion-shaped sections. The four protrusion-shaped sections 92 are arranged with clearances therebetween, and the clearances can form gaps between the parting plate 72b and the display section 70. The gaps are so provided as to extend from the outer circumferential edge 72p of the parting plate 72b to the inner circumferential edge 72h thereof and can therefore function as air-flow channels that allow the internal space 36 as the first region to communicate with the space 42 as the second region.

In the present Variation 2, the configuration in which the four protrusion-shaped sections 92 are arranged at equal intervals is presented by way of example, but the arrangement of the protrusion-shaped sections 92 and the number thereof are not limited to those described above, and any arrangement and number of protrusion-shaped sections 92 may be employed. Further, the protrusion-shaped sections 92 may be integrated with the parting plate 72b or may be configured as spacers that are separate from the parting plate 72b.

A parting plate 72c according to Variation 3 will next be described with reference to FIG. 10. The parting plate 72c according to Variation 3 is none of the ring-shaped plate members described above but has a cross-sectional shape having an inclining front-side surface 72cf that inclines with respect to a rear-side surface 72cr, which faces the display section 70. In the present variation, the front-side surface 72cf is an inclining surface oriented toward the center of the ring (toward the interior of the ring). In other words, the parting plate 72c has a ring shape having a thickness that increases toward the outer circumference of the ring.

The parting plate 72c is provided with recessed sections 89c as air-flow channels that the allow the internal space 36 as the first region to communicate with the space 42 as the second region, as in the case of the parting plate 72 in the first embodiment. The recessed sections 89c are formed in a rear-side (side facing display section 70) surface 72cr of the parting plate 72c and so provided as to extend from the outer circumferential edge of the parting plate 72c to the inner circumferential edge thereof. The thus configured recessed sections 89c can function as air-flow channels that allow the internal space 36 as the first region to communicate with the space 42 as the second region. The recessed sections 89c link the internal space 36 to the space 42 via the clearance 38 as the air-flow channel between the outer edge of the display section 70 and the top case 30 and therefore allow air flow between the internal space 36 and the space 42 along the arrow Q in FIG. 10.

Second Embodiment

Figure 11A:
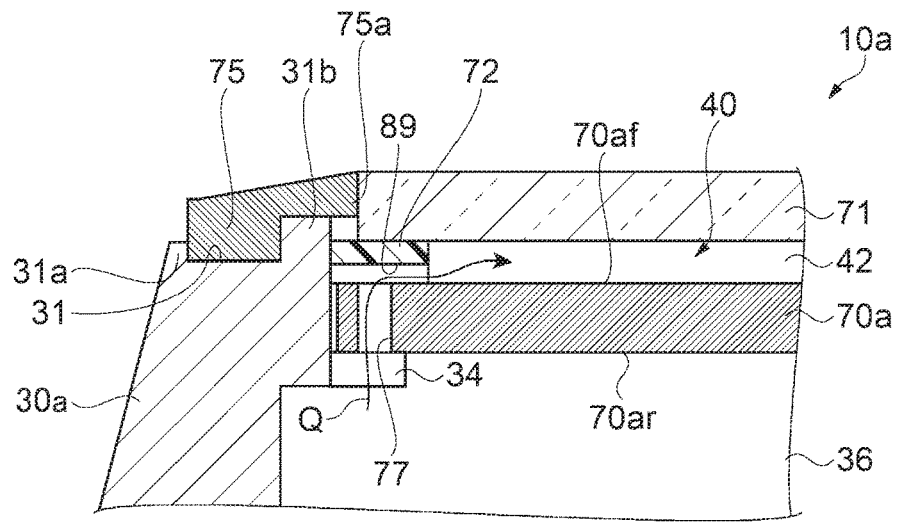
FIG. 11A shows a schematic configuration of a wrist apparatus according to a second embodiment and is a partially enlarged view corresponding to FIG. 5.
Figure 11B:
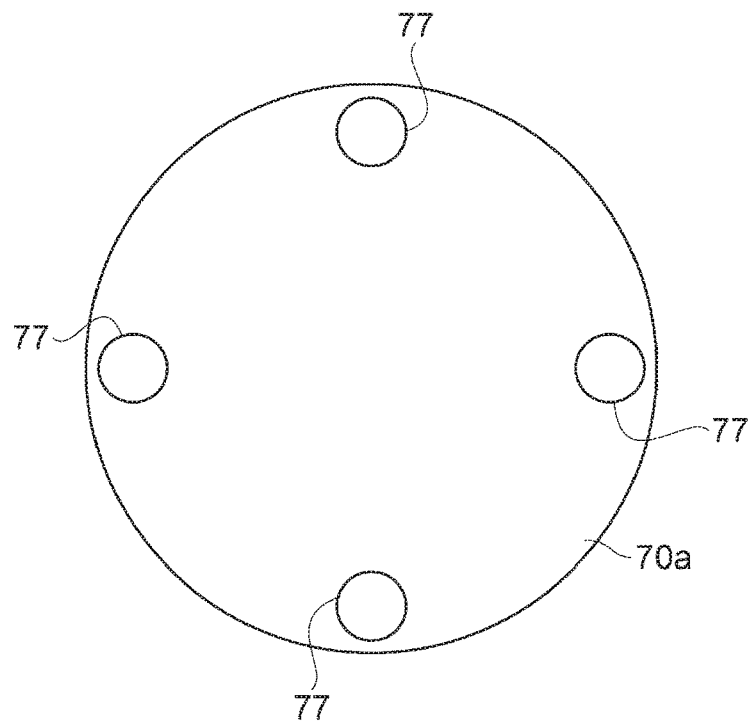
FIG. 11B is a plan view of a display section of the wrist apparatus according to the second embodiment.

An overview of a wrist apparatus according to a second embodiment of the portable electronic apparatus of the aspect of the invention will next be described with reference to FIGS. 11A and 11B. FIG. 11A shows a schematic configuration of the wrist apparatus according to the second embodiment and is a partially enlarged view corresponding to FIG. 5. FIG. 11B is a plan view of a display section of the wrist apparatus according to the second embodiment.

The wrist apparatus according to the second embodiment includes an apparatus body 10a in place of the apparatus body 10 of the wrist apparatus 1.

The apparatus body 10a is provided with the internal space 36 (first region), which is a sealed space present in the case and surrounded by a top case 30a, the bottom case (not shown), and the windshield 71, which closes the opening section 40 of the top case 30a, as shown in FIGS. 11A and 11B. A display section 70a, the parting plate 72 as a ring member, and the same constituent parts as those in the first embodiment are disposed in the internal space 36. Although not shown, the sheet-shaped hygroscopic member 65 (see FIG. 4) is disposed in the internal space 36.

In the apparatus body 10a, the display section 70a is placed on the front side (side facing windshield 71) of the projecting section 34, which projects inward in the top case 30a, as in the case of the top case 30 in the first embodiment. The parting plate 72 is then placed on the front side (side facing windshield 71) of the display section 70a and along the second wall section 31b of the top case 30a. The arrangement described above provides, as the second region surrounded by the display section 70a, the windshield 71, and the parting plate 72, the space 42, which is independent of and separate from the internal space 36 as the first region.

Four through holes 77 as first holes, which pass through the display section 70a from a surface 70af on the side facing the windshield 71 to a surface 70ar on the side opposite the surface 70af, are provided at equal intervals in an outer edge portion of the display section 70a. The through holes 77 function as one type of air-flow channel that allows air to flow between the internal space 36 and the space 42. The configuration in which the four through holes 77 are arranged at equal intervals is presented by way of example, but the shape and arrangement of the through holes 77 and the number thereof are not limited to those described above, and any shape, arrangement, and number of through holes 77 may be employed.

The parting plate 72 is a ring-shaped plate member and is provided with the recessed sections 89 as the air-flow channels that allow the internal space 36 as the first region to communicate with the space 42 as the second region, as in the first embodiment. The configuration of the parting plate 72 is the same as that in the first embodiment and will not therefore be described in detail. The recessed sections 89 can function as the air-flow channels that allow the internal space 36 as the first region to communicate with the space 42 as the second region. The recessed sections 89, in conjunction with the through holes 77 in the display section 70a, link the internal space 36 to the space 42 and therefore allow air flow between the internal space 36 and the space 42 along the arrow Q in FIG. 11A.

In the portable electronic apparatus according to the second embodiment, the through holes 77 as the first holes provided in the outer edge portion of the display section 70a form the air-flow channels that allow the first region (internal space 36) to communicate with the second region (space 42), which the windshield 71 faces, allowing the dehumidified air to spread over the second region (space 42) for ventilation. As a result, the air in the second region (space 42), which faces the windshield 71, where the fogging phenomenon occurs, can be dehumidified, whereby the windshield 71 can be defogged in an excellent manner.

Third Embodiment

Figure 12A:
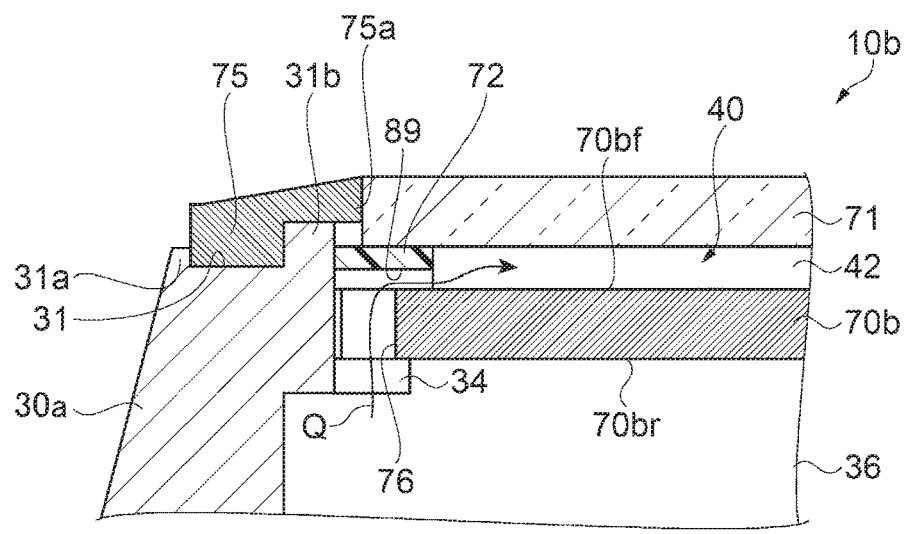
FIG. 12A shows a schematic configuration of a wrist apparatus according to a third embodiment and is a partially enlarged view corresponding to FIG. 5.
Figure 12B:
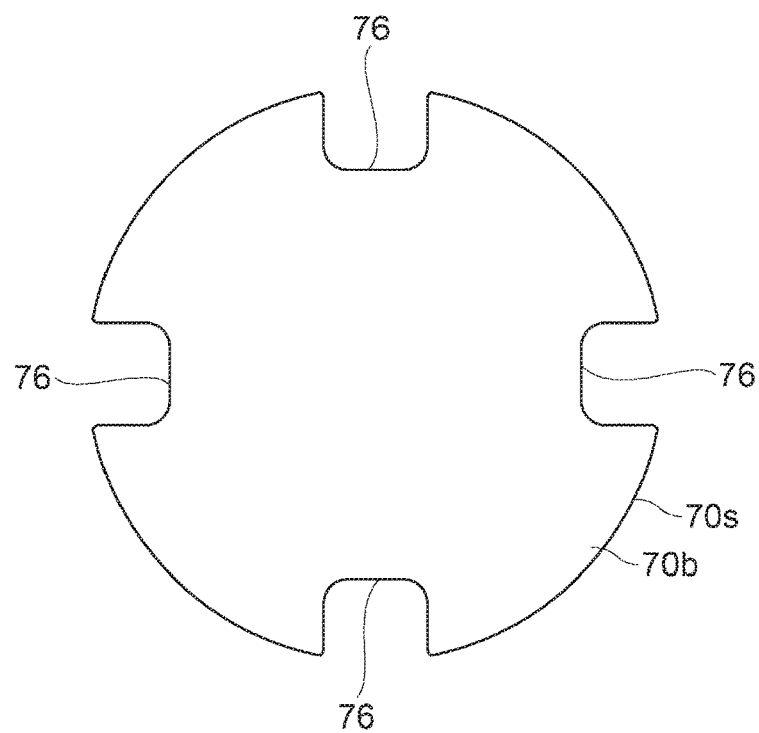
FIG. 12B is a plan view of a display section of the wrist apparatus according to the third embodiment.

An overview of a wrist apparatus according to a third embodiment of the portable electronic apparatus of the aspect of the invention will next be described with reference to FIGS. 12A and 12B. FIG. 12A shows a schematic configuration of the wrist apparatus according to the third embodiment and is a partially enlarged view corresponding to FIG. 5. FIG. 12B is a plan view of a display section of the wrist apparatus according to the third embodiment.

The wrist apparatus according to the third embodiment includes an apparatus body 10b in place of the apparatus body 10 of the wrist apparatus 1.

The apparatus body 10b is provided with the internal space 36 (first region), which is a sealed space present inside the case and surrounded by the top case 30a, the bottom case (not shown), and the windshield 71, which closes the opening section 40 of the top case 30a, as shown in FIGS. 12A and 12B. A display section 70b, the parting plate 72, and the same constituent parts as those in the first embodiment are disposed in the internal space 36. Although not shown, the sheet-shaped hygroscopic member 65 (see FIG. 4) is disposed in the internal space 36.

In the apparatus body 10b, the display section 70b is placed on the front side (side facing windshield 71) of the projecting section 34, which projects inward in the top case 30a, as in the second embodiment. The parting plate 72 is then placed on the front side (side facing windshield 71) of the display section 70b and along the second wall section 31b of the top case 30a. The arrangement described above provides, as the second region surrounded by the display section 70b, the windshield 71, and the parting plate 72, the space 42, which is independent of and separate from the internal space 36 as the first region.

Four first recessed sections 76 are provided at equal intervals in an outer edge portion of the display section 70b, and the first recessed sections 76 pass through the display section 70b from a surface 70bf on the side facing the windshield 71 to a surface 70br on the side opposite the surface 70bf and are recessed from the outer edge (outer circumferential edge) 70s of the display section 70b toward the center thereof. The first recessed sections 76 function as one type of air-flow channel that allows air to flow between the internal space 36 and the space 42. The configuration in which the four first recessed sections 76 are arranged at equal intervals is presented by way of example, but the shape and arrangement of the first recessed sections 76 and the number thereof are not limited to those described above, and any shape, arrangement, and number of first recessed sections 76 may be employed.

The parting plate 72 is a ring-shaped plate member and is provided with the recessed sections 89 as the air-flow channels that allow the internal space 36 as the first region to communicate with the space 42 as the second region, as in the first embodiment. The configuration of the parting plate 72 is the same as that in the first embodiment and will not therefore be described in detail. The recessed sections 89 can function as the air-flow channels that allow the internal space 36 as the first region to communicate with the space 42 as the second region. Further, the recessed sections 89, in conjunction with the first recessed sections 76 in the display section 70b, link the internal space 36 to the space 42 and therefore allow air flow between the internal space 36 and the space 42 along the arrow Q in FIG. 12A.

In the portable electronic apparatus according to the third embodiment, the first recessed sections 76, which are located in the outer edge portion of the display section 70b and recessed from the outer edge (outer circumferential edge) 70s of the display section 70b toward the center thereof, form the air-flow channels that allow the first region (internal space 36) to communicate with the second region (space 42), which the windshield 71 faces, allowing the dehumidified air to spread over the second region (space 42) for ventilation. As a result, the air in the second region (space 42), which faces the windshield 71, where the fogging phenomenon occurs, can be dehumidified, whereby the windshield 71 can be defogged in an excellent manner.

Fourth Embodiment

Figure 13A:
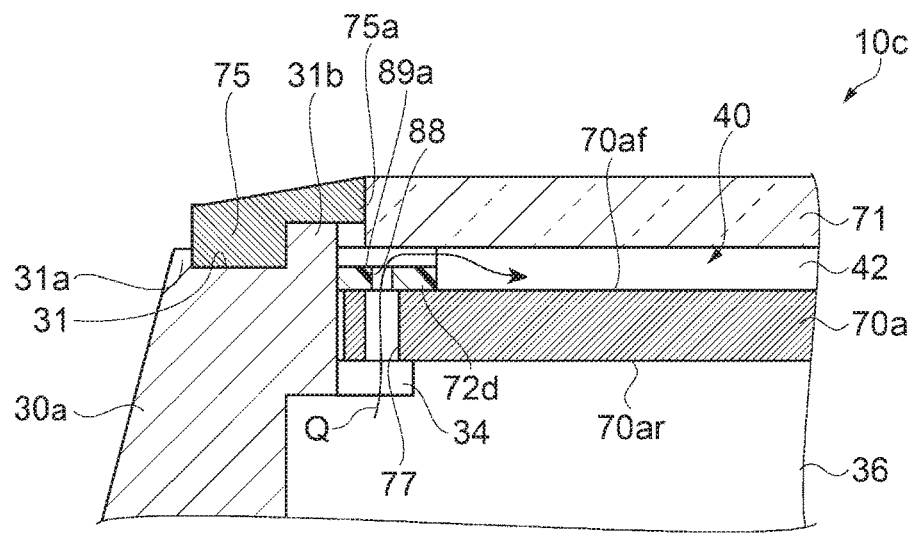
FIG. 13A shows a schematic configuration of a wrist apparatus according to a fourth embodiment and is a partially enlarged view corresponding to FIG. 5.
Figure 13B:
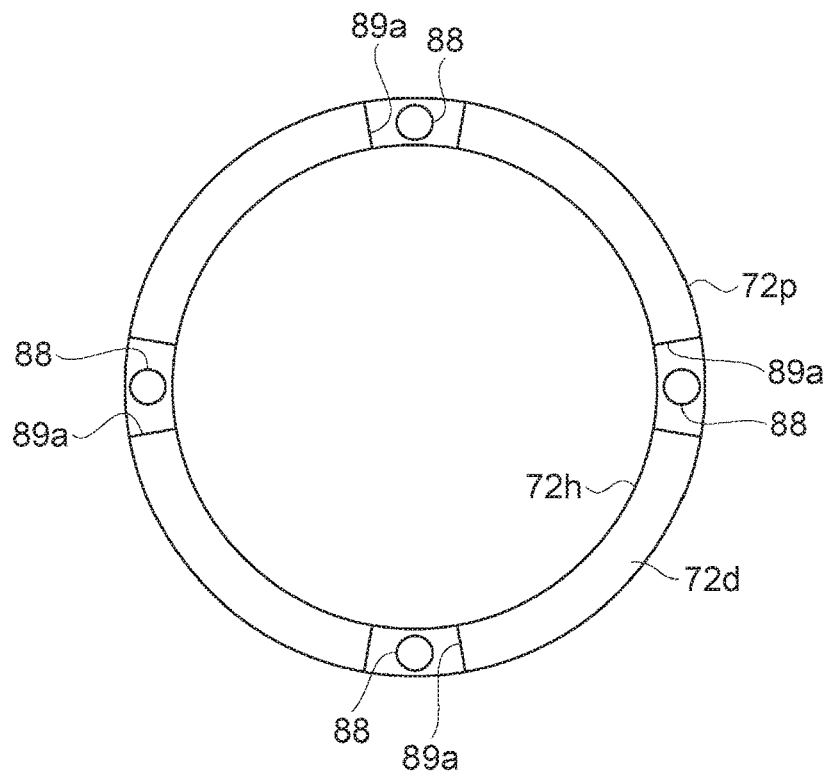
FIG. 13B is a plan view of a parting plate of the wrist apparatus according to the fourth embodiment.

An overview of a wrist apparatus according to a fourth embodiment of the portable electronic apparatus of the aspect of the invention will next be described with reference to FIGS. 13A and 13B. FIG. 13A shows a schematic configuration of the wrist apparatus according to the fourth embodiment and is a partially enlarged view corresponding to FIG. 5. FIG. 13B is a plan view of a parting plate of the wrist apparatus according to the fourth embodiment.

The wrist apparatus according to the fourth embodiment includes an apparatus body 10c in place of the apparatus body 10 of the wrist apparatus 1.

The apparatus body 10c is provided with the internal space 36 (first region), which is a sealed space present inside the case and surrounded by the top case 30a, the bottom case (not shown), and the windshield 71, which closes the opening section 40 of the top case 30a, as shown in FIGS. 13A and 13B. The display section 70a, a parting plate 72d as a ring member, and the same constituent parts as those in the first embodiment are disposed in the internal space 36. Although not shown, the sheet-shaped hygroscopic member 65 (see FIG. 4) is disposed in the internal space 36.

In the apparatus body 10c, the display section 70a is placed on the front side (side facing windshield 71) of the projecting section 34, which projects inward in the top case 30a, as in the case of the top case 30 in the first embodiment. The parting plate 72d is then placed on the front side (side facing windshield 71) of the display section 70a and along the second wall section 31b of the top case 30a. The arrangement described above provides, as the second region surrounded by the display section 70a, the windshield 71, and the parting plate 72d, the space 42, which is independent of and separate from the internal space 36 as the first region.

The configuration of the display section 70a is the same as that in the second embodiment and will therefore not be described in detail.

The parting plate 72d is a ring-shaped plate member. The parting plate 72d is provided with through holes 88 as second holes, which face the through holes 77 provided in the display section 70a and pass through the parting plate 72d from the surface thereof on the side facing the windshield 71 to the surface thereof on the side facing the display section 70a. In addition, the parting plate 72d is provided with recessed sections 89a, which overlap with at least part of the through holes 88 in the plan view. The recessed sections 89a are located in a surface of the parting plate 72d, the surface facing the windshield 71, and pass through the parting plate 72d from the outer circumferential edge 72p to the inner circumferential edge 72h. The through holes 88 and the recessed sections 89a function as air-flow channels that allow the internal space 36 as the first region to communicate with the space 42 as the second region. Further, the through holes 88 and the recessed sections 89a, in conjunction with the through holes 77 in the display section 70a, link the internal space 36 to the space 42 and therefore allow air flow between the internal space 36 and the space 42 along the arrow Q in FIG. 13A.

In the portable electronic apparatus according to the fourth embodiment, the through holes 77 as the first holes, which are provided in the outer edge portion of the display section 70a, the through holes 88 as the second holes, which face the through holes 77 and pass through the parting plate 72d from the surface thereof on the side facing the windshield 71 to the surface thereof on the side facing the display section 70a, and the recessed sections 89a form the air-flow channels that allow the first region (internal space 36) to communicate with the second region (space 42), which the windshield 71 faces, allowing the dehumidified air to spread over the second region (space 42) for ventilation. As a result, the air in the second region (space 42), which faces the windshield 71, where the fogging phenomenon occurs, can be dehumidified, whereby the windshield 71 can be defogged in an excellent manner.

In the portable electronic apparatus according to the fourth embodiment, the through holes 88 as the second holes provided in the parting plate 72d may be replaced with second recessed sections so provided as to pass through the parting plate 72d from the surface thereof on the side facing the windshield 71 to the surface thereof opposite the surface on the side facing the windshield 71 and recessed from the outer circumferential edge of the parting plate 72d toward the center thereof, and the second recessed sections may be used as one type of air-flow channel. Also in this configuration, the effect of defogging the windshield 71 is provided, as in the portable electronic apparatus according to the fourth embodiment.

Fifth Embodiment

Figure 14A:
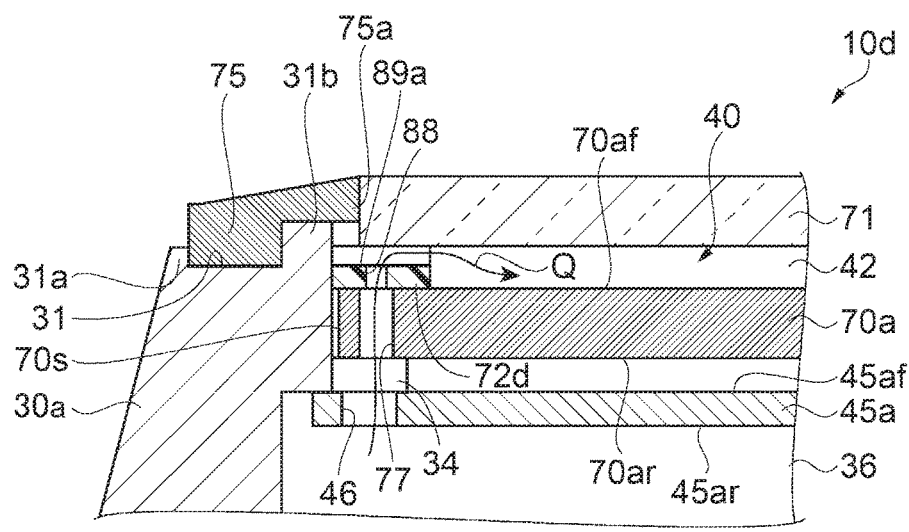
FIG. 14A shows a schematic configuration of a wrist apparatus according to a fifth embodiment and is a partially enlarged view corresponding to FIG. 5.
Figure 14B:
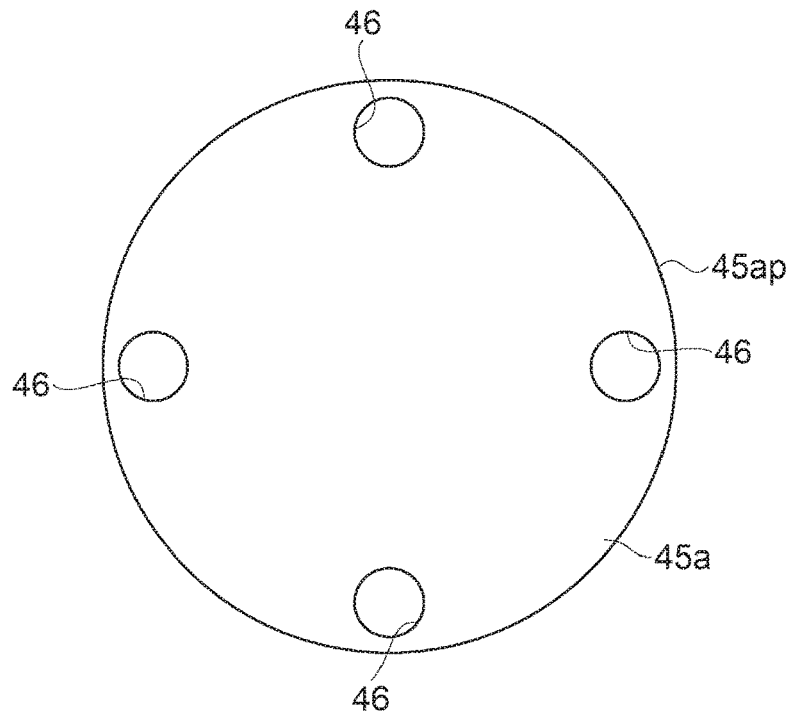
FIG. 14B is a plan view of a circuit substrate of the wrist apparatus according to the fifth embodiment.
Figure 14C:
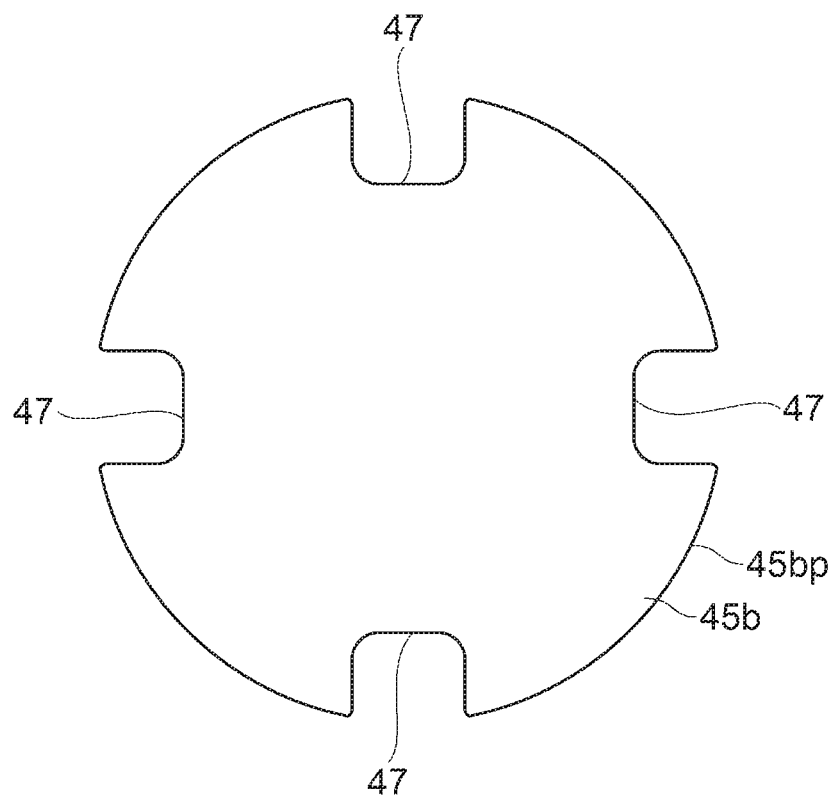
FIG. 14C is a plan view showing a variation of the circuit substrate of the wrist apparatus according to the fifth embodiment.

An overview of a wrist apparatus according to a fifth embodiment of the portable electronic apparatus of the aspect of the invention will next be described with reference to FIGS. 14A, 14B, and 14C. FIG. 14A shows a schematic configuration of the wrist apparatus according to the fifth embodiment and is a partially enlarged view corresponding to FIG. 5. FIG. 14B is a plan view of a circuit substrate of the wrist apparatus according to the fifth embodiment. FIG. 14C is a plan view showing a variation of the circuit substrate of the wrist apparatus according to the fifth embodiment.

An apparatus body 10d is provided with the internal space 36 (first region), which is a sealed space present inside the case and surrounded by the top case 30a, the bottom case (not shown), and the windshield 71, which closes the opening section 40 of the top case 30a, as shown in FIGS. 14A and 14B. The display section 70a, the parting plate 72d as a ring member, and the same constituent parts as those in the first embodiment are disposed in the internal space 36. Although not shown, the sheet-shaped hygroscopic member 65 (see FIG. 4) is disposed in the internal space 36 and on the side opposite the side facing the display section 70a with respect to a circuit substrate 45a. That is, the apparatus body 10d has the same configuration as that of the apparatus body 10c with the circuit substrate 45 replaced with the circuit substrate 45a. The configuration of the display section 70a is the same as that in the second embodiment and will therefore not be described in detail.

In the apparatus body 10d, in the internal space 36 as the first region, the circuit substrate 45a, which is so disposed as to overlap with the display section 70a in the plan view, is connected to the rear side (side opposite windshield 71) of the projecting section 34, which projects inward in the top case 30a. On an outer portion on the side of an outer periphery 45ap of the circuit substrate 45a, through holes 46 as third holes, which face the through holes 77 and passes through the circuit substrate 45a from a surface 45af thereof on the side facing the display section to a surface 45ar thereof on the side opposite the surface 45af. The through holes 46 function as one type of air-flow channel that allows air flow between the internal space 36 and the space 42.

In the portable electronic apparatus according to the fifth embodiment, the through holes 77 as the first holes, which are provided in the outer edge portion of the display section 70a, the through holes 46 as the third holes, which face the through holes 77 and are provided in the circuit substrate 45a, the through holes 88 as the second holes, and the recessed sections 89a form the air-flow channels that allow the first region (internal space 36) to communicate with the second region (space 42), which the windshield 71 faces, allowing the dehumidified air to spread over the second region (space 42) for ventilation. As a result, the air in the second region (space 42), which faces the windshield 71, where the fogging phenomenon occurs, can be dehumidified, whereby the windshield 71 can be defogged in an excellent manner.

As the air-flow channels provided in the circuit substrate, the through holes 46 as the third holes, which are provided in the circuit substrate 45a, can be replaced with third recessed sections 47, which are provided in a circuit substrate 45b and shown in FIG. 14C.

Specifically, the circuit substrate 45b is provided with third recessed sections 47, which pass through the circuit substrate 45b from the surface thereof on the side facing the display section 70a to the surface thereof on the side opposite the surface facing the display section 70a and recessed from the outer circumferential edge 45bp of the circuit substrate 45b toward the center thereof, as shown in FIG. 14C. The third recessed sections 47 are so provided as to face the through holes 77, which are located in an outer edge portion that forms the display section 70a and faces the outer circumferential edge 70s and serve as the first holes that pass through the display section 70a from the surface 70af thereof on the side facing the windshield 71 to the surface 70ar thereof on the side opposite the surface 70af, as shown in FIG. 14A.

Also in the configuration described above, the through holes 77, the third recessed sections 47, which faces the through holes 77 and are provided in the circuit substrate 45b, the through holes 88 as the second holes, and the recessed sections 89a form the air-flow channels that allow the first region (internal space 36) to communicate with the second region (space 42), which the windshield 71 faces, allowing the dehumidified air to spread over the second region (space 42) for ventilation. As a result, the second region (space 42), which faces the windshield 71, where the fogging phenomenon occurs, can be dehumidified, whereby the windshield 71 can be defogged in an excellent manner.

Figure 15A:
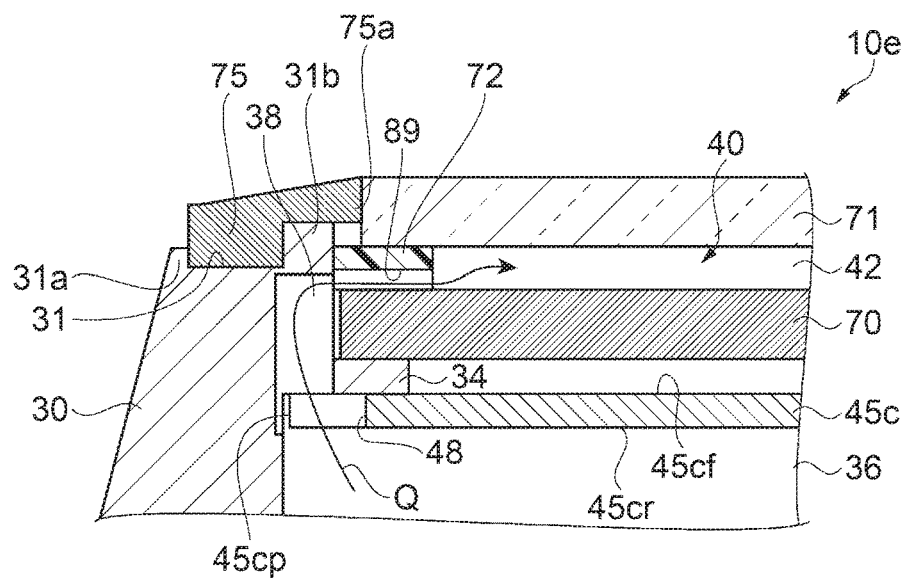
FIG. 15A shows an application example of the circuit substrate and is a partially enlarged view corresponding to FIG. 5.
Figure 15B:
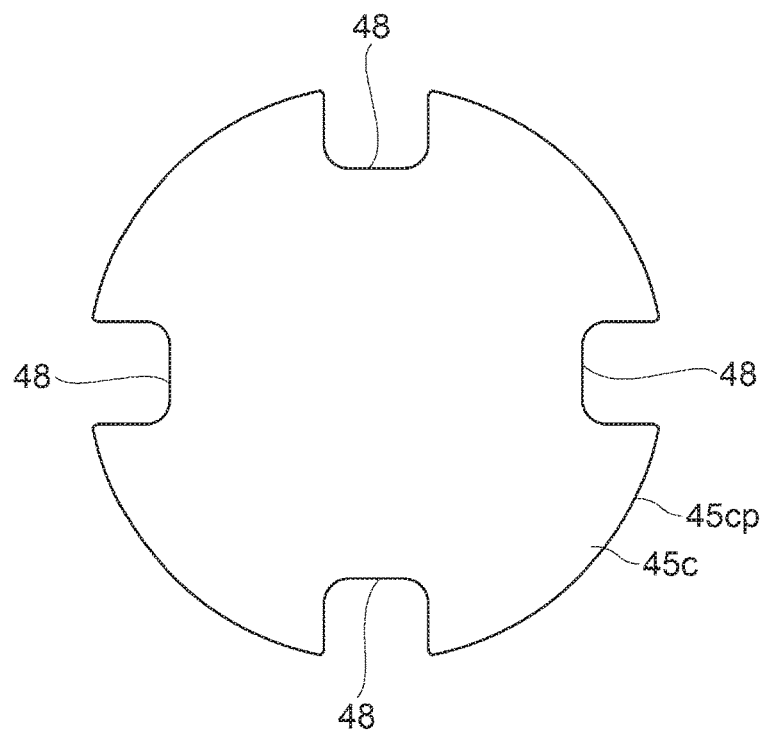
FIG. 15B is a plan view showing the application example of the circuit substrate.

The air-flow channels can instead be configured as shown in FIGS. 15A and 15B. FIG. 15A shows an application example of the circuit substrate and a partially enlarged view corresponding to FIG. 5. FIG. 15B is a plan view showing the application example of the circuit substrate.

A circuit substrate 45c, which is the application example and forms an apparatus body 10e shown in FIGS. 15A and 15B, is so disposed in the internal space 36 as the first region and on the rear side (side opposite windshield 71) of the projecting section 34, which projects inward in the top case 30, as to overlap with the display section 70 in the plan view. The circuit substrate 45c is provided with fourth recessed sections 48, which pass through the circuit substrate 45c from a surface 45cf thereof on the side facing the display section 70 to a surface 45cr thereof on the side opposite the surface 45cf and recessed from the outer circumferential edge 45cp of the circuit substrate 45c toward the center thereof. The fourth recessed sections 48 function as one type of air-flow channel that allows air flow between the internal space 36 and the space 42 and link the internal space 36 to the space 42 via the clearance 38 as the air-flow channel between the outer edge of the display section 70 and the top case 30 and the recessed sections 89 of the parting plate 72, allowing air flow between the internal space 36 and the space 42 along the arrow Q in FIG. 15A.

As the air-flow channel that allows the internal space 36 as the first region to communicate with the space 42 as the second region, any of the configurations in the first to fifth embodiments described above may be used, or the configurations in the first to fifth embodiments and the configurations in the variations and application examples may be arbitrarily combined with one another to form an air-flow channel.

Further, in the above description, the parting plates 72 and 72d are presented by way of example of the ring members that form the apparatus bodies 10 and 10a to 10e, but not necessarily. The ring member may instead be a ring-shaped member formed of an elastic member primarily made, for example, of a rubber or resin material. Such a ring member may specifically be a ring-shaped buffer member disposed between the windshield 71 and the display section 70 and having a buffering function of preventing damage externally done to the display section 70.

Sixth Embodiment

An overview of a wrist apparatus according to a sixth embodiment of the portable electronic apparatus of the aspect of the invention will next be described with reference to the drawings.

A wrist apparatus 1A according to the sixth embodiment includes an apparatus body 110 in place of the apparatus body 10 of the wrist apparatus 1, as shown in FIGS. 1 and 2.

The apparatus body 110 is so configured that the bottom case 33 is disposed on the side where the wrist apparatus 1A is worn on the user and a top case 130 having the opening section 40 (see FIG. 17) which opens toward the front side, is disposed on the side opposite the side where the wrist apparatus 1A is worn on the user. The bottom case 33 and the top case 130 form a case. The bezel 75 is provided outside of the opening section 40, which is located on the front side of the apparatus body 110 (top case 130), and the windshield (glass plate in the present example) 71, which serves as a top plate portion (outer wall) that protects the internal structure of the apparatus body 110, is so provided inside the bezel 75 as to line up with the bezel 75. The windshield 71 is so disposed as to close the opening section 40 of the top case 130. The plurality of buttons 80 and 81 are provided on the side surface of the front side (top case 130) of the apparatus body 110. The bezel 75 can be provided with displayed information visually recognizable from the front side.

The apparatus body 110 further includes the display section 70, which is disposed immediately below the windshield 71 and formed, for example, of a liquid crystal display (LCD), and a parting plate 172 as a ring member, which is disposed between an outer edge portion of the windshield 71 and the display section 70. The parting plate 172 can be provided with displayed information visually recognizable from the front side. The apparatus body 110 may be so configured that the user can view the displayed information on the display section 70 and the displayed information on the parting plate 172 via the windshield 71. That is, in the wrist apparatus 1A according to the present embodiment, detected position information, motion information, time information, or a variety of other pieces of information may be displayed in the display section 70, and the displayed information on the front side of the apparatus body 110 may be presented to the user.

The display section 70 and the windshield 71 are the same as those in the embodiments described above and will therefore not be described in detail.

Figure 16:
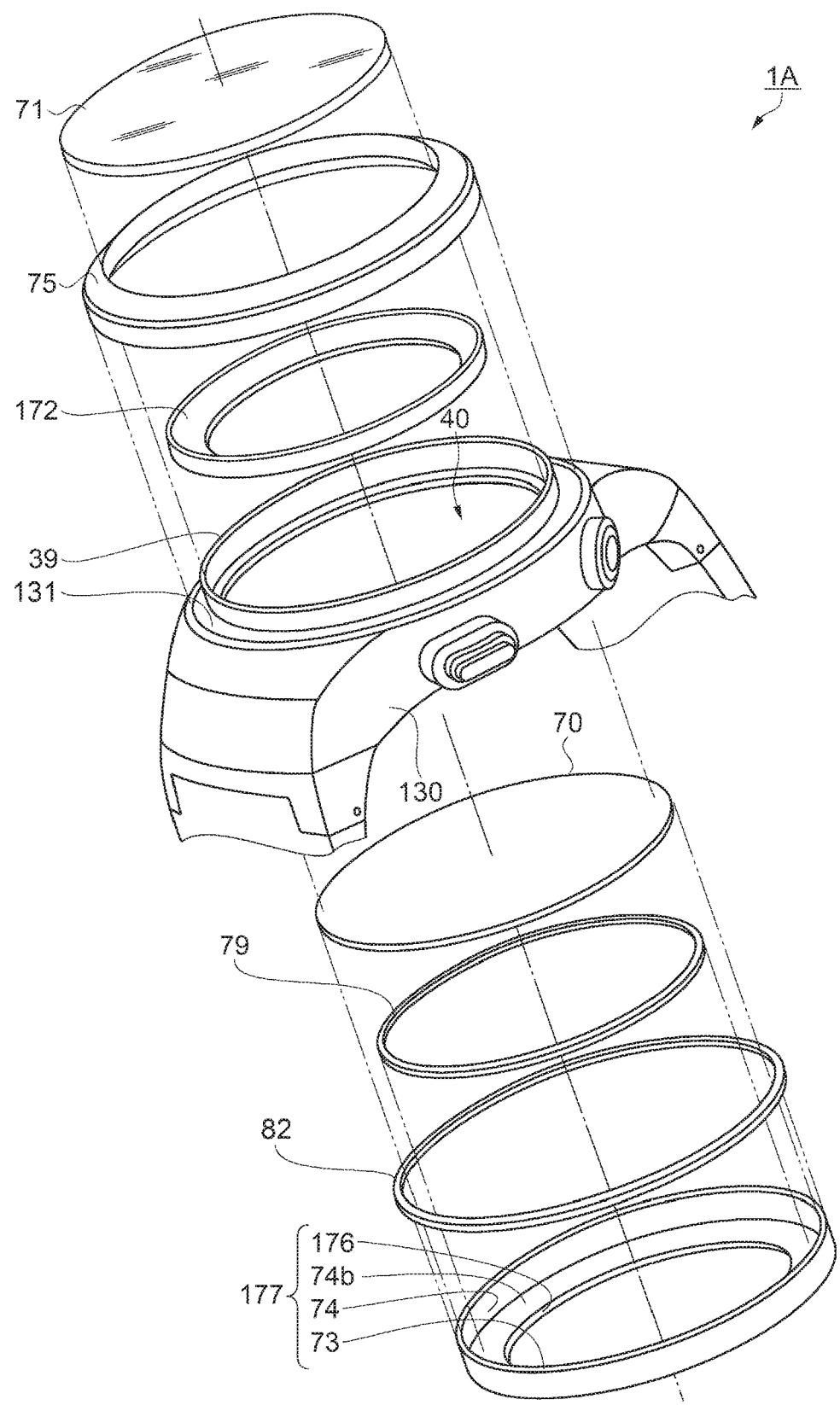
FIG. 16 is an exploded perspective view showing a schematic configuration of a wrist apparatus according to a sixth embodiment.
Figure 17:
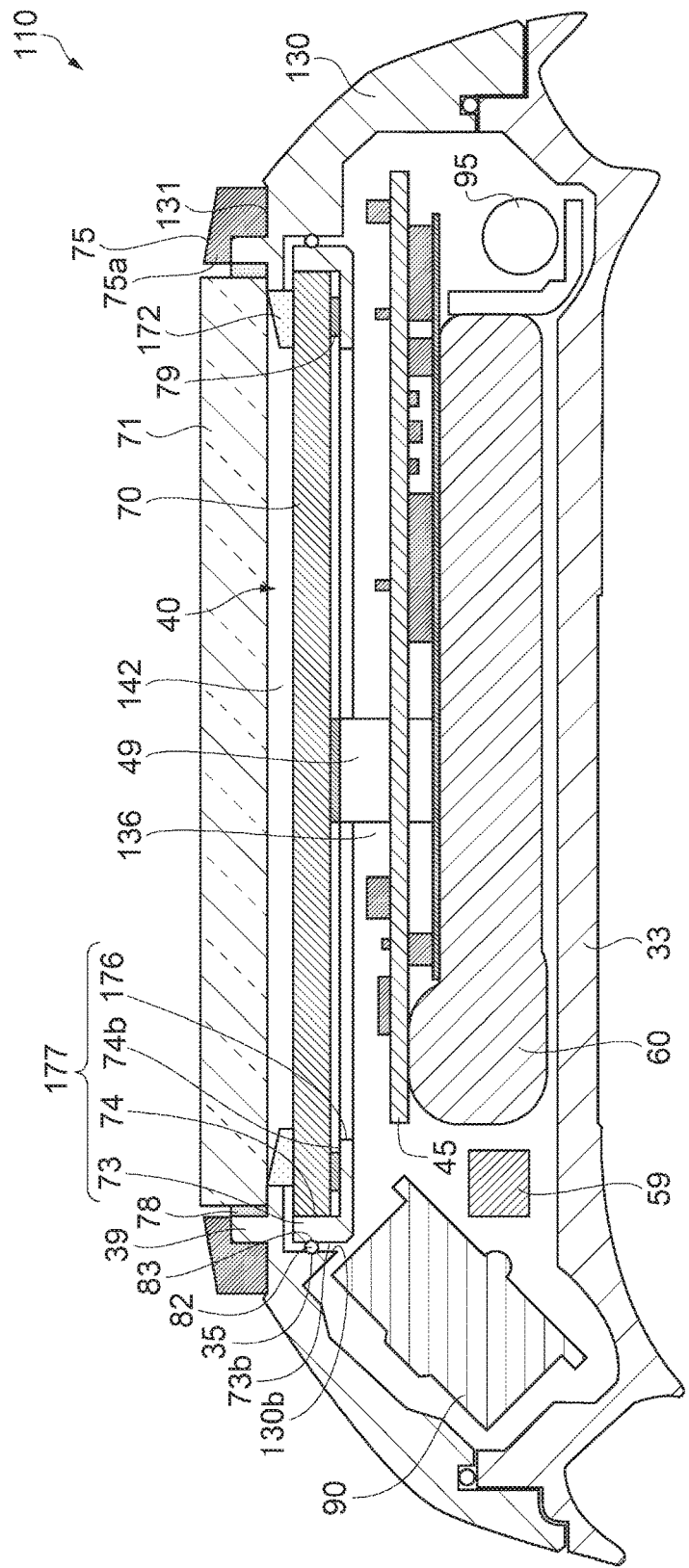
FIG. 17 is a cross-sectional view taken along the line A-A in FIG. 2 and showing the schematic configuration of the wrist apparatus according to the sixth embodiment.
Figure 18:
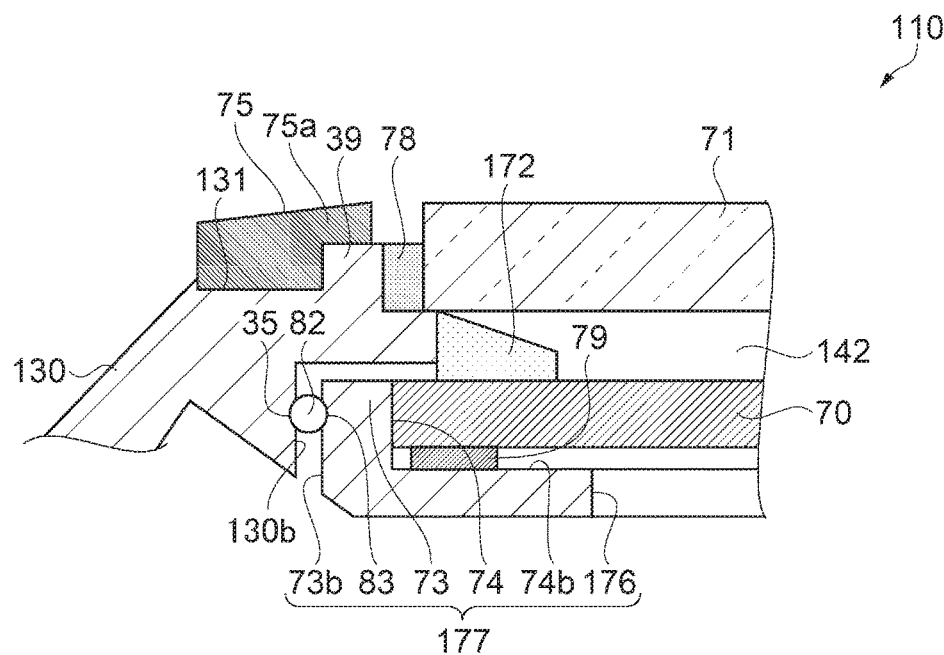
FIG. 18 is a partially enlarged view of FIG. 17 and shows the portion where a second seal member is disposed.
Figure 19:
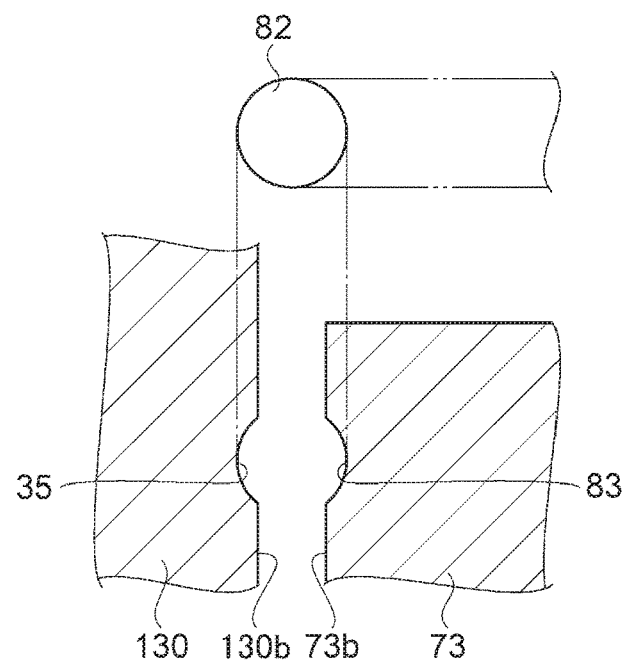
FIG. 19 is a partially enlarged view of FIG. 18 and shows an example of the configuration of the portion where the second seal member is disposed.

An example of the configuration of the cross-sectional structure of the apparatus body 110 will next be described with reference to FIGS. 16, 17, 18, and 19. FIG. 16 is an exploded perspective view showing a schematic configuration of the wrist apparatus according to the sixth embodiment. FIG. 17 is a cross-sectional view taken along the line A-A in FIG. 2 and showing the schematic configuration of the wrist apparatus according to the sixth embodiment. FIG. 18 is a partially enlarged view of FIG. 17 and shows the portion where a second seal member is disposed. FIG. 19 is a partially enlarged view of FIG. 18 and shows an example of the configuration of the portion where the second seal member is disposed.

The apparatus body 110 is provided with an internal space that is a sealed space present inside a case formed of the top case 130 and the bottom case 33 and surrounded by the top case 130, the bottom case 33, and the windshield 71, which closes the opening section 40 of the top case 130 via a joint member 78 in an airtight manner, as shown in FIGS. 16, 17, and 18. The internal space accommodates, for example, the display section 70, the parting plate 172, a frame 177, which holds the display section 70, the circuit substrate 45, the GPS (global positioning system) antenna 90, the geomagnetism sensor 59 as an example of a sensor, the secondary battery 60, and a vibrator 95, which are element parts that form the wrist apparatus 1A. The apparatus body 110 does not necessarily have the configuration shown in FIG. 17, and other sensors, for example, a barometric sensor, and other electronic parts may be added. Further, a control circuit, a drive circuit, and other circuits that control the element parts that form the wrist apparatus 1A, the display section 70, and other parts are connected to the circuit substrate 45.

The internal space, which is a sealed space inside the case, include a first space 142, which is a space located between the windshield 71 and the display section 70, and a second space 136, which is provided on the side opposite the first space 142 via the display section 70 and the frame 177.

The frame 177 includes a recessed concave section 74, which has a wall section 73 along the outer circumference, opens toward the windshield 71, and has an inner bottom surface 74b inside the wall section 73. The inner bottom surface 74b of the recessed concave section 74 is provided with a through hole 176, which passes through the front and rear surfaces of a central portion of the inner bottom surface 74b. On the frame 177, the display section 70 is attached via a circumferential first seal member 79 to the inner bottom surface 74b located around the outer circumference of the through hole 176 of the recessed concave section 74. The first seal member 79 isolates the second space 136 from the front side of the display section 70 (first space 142) via the through hole 176. The frame 177, to which the display section 70 is attached, is attached to the top case 130 with an annular second seal member 82 sandwiched between an outer side surface 73b of the wall section 73 and an inner surface 130b of the top case 130. In other words, since the frame 177 is attached to the top case 130, the display section 70 is disposed with the first space 142 sandwiched between the display section 70 and the windshield 71.

The first seal member 79 can be formed of an elastic member having at least one of waterproofness and gas barrier capability or a joint member having at least one of waterproofness and gas barrier capability. Examples of the elastic member having at least one of waterproofness and gas barrier capability may include a rubber gasket (O ring) and a silicon resin gasket (O ring), and examples of the joint member having waterproofness may include an adhesive and a glass joining material primarily made of a silicon resin.

The second seal member 82 is preferably an elastic member having at least one of waterproofness and gas barrier capability. Examples of the elastic member having at least one of waterproofness and gas barrier capability may include a rubber gasket (O ring) and a silicon resin gasket (O ring). The second seal member 82 preferably has a circular cross-sectional shape or an arcuate outer shape.

Preferable examples of the material having a gas barrier capability include polyethylene terephthalate (PET resin) and a vinylidene chloride (polyvinylidene chloride) resin.

The annular second seal member 82 formed of an elastic member having at least one of waterproofness and gas barrier capability as described above prevents entry of moisture (water and water vapor, for example) into the first space 142 formed by the windshield 71 and the display section 70, whereby the fogging phenomenon due to dew condensation that occurs on the windshield 71 resulting, for example, from a change in outside temperature and humidity can be suppressed. Further, the circular cross-sectional shape or the arcuate outer shape of the second seal member 82 allows an increase in the degree of intimate contact between the second seal member 82 and the top case 130 and between the second seal member 82 and the frame 177, whereby the airtightness of the first space 142 between the windshield 71 and the display section 70 can be improved.

Further, the annular second seal member 82 disposed between the outer side surface 73b of the wall section 73 of the frame 177 and the inner surface 130b of the top case 130 as described above allows the frame 177 and the top case 130 to be connected to each other in an airtight manner.

Moreover, since the frame 177 is attached to the inner side of the top case 130 via the second seal member 82, the space surrounded by the frame 177, to which the display section 70 is attached via the first seal member 79, the top case 130, and the windshield 71 forms the first space 142, which is a sealed space separate from the second space 136. In other words, the frame 177 is attached to the inner side of the top case 130 via the second seal member 82 in such a way that the second space 136, which is provided on the side opposite the first space 142 via the display section 70 and the frame 177, is separate from the first space 142 and the first space 142 forms a sealed space.

A recess is preferably provided in at least one of the inner surface 130b of the top case 130 and the outer side surface 73b of the wall section 73 of the frame 177 and in a portion that is in contact with the second seal member 82, as shown in FIG. 19, which is an enlarged view. Specifically, in the present form, a first recessed section 35 is provided as the recess in the inner surface 130b of the top case 130 and along the outer edge of the second seal member 82, and a second recessed section 83 is provided as the recess in the outer side surface 73b of the wall section 73 of the frame 177 and along the inner edge of the second seal member 82.

Providing a recess (first recessed section 35 or second recessed section 83) in the top case 130 or the frame 177 and in a portion that is in contact with the second seal member 82 allows the frame 177 to be stably held with the second seal member 82 securely positioned, whereby the degree of intimate contact between the second seal member 82 and the top case 130 or the frame 177 can be improved.

The second space 136, which is a sealed space on the side where the wrist apparatus 1A is worn on the user, is likely to be affected by the user's body temperature. In a case where the temperature in the environment in which the wrist apparatus 1A is present is lower than the user's body temperature, the temperature in the second space 136 is relatively higher than the environment temperature. In the present embodiment, since the space outside the apparatus body 110, which forms the wrist apparatus 1A, and the second space 136, which has a relatively high internal temperature, are located via the first space 142, which is isolated from the second space 136, the first space 142 serves as a buffer space, and the temperature in the second space 136 is not directly equal to the temperature inside the windshield 71. That is, a situation in which the difference in temperature between the spaces outside and inside (first space 142) the windshield 71 rapidly increases can be avoided, whereby the fogging phenomenon due to dew condensation that occurs on the inner surface of the windshield 71 (first space 142) can be suppressed.

More in detail, assuming that the temperature in the space outside the wrist apparatus 1A (environment temperature) is an outside temperature Ot, the temperature in the first space 142, which is a sealed space, is a first space temperature Ct, and the temperature in the second space 136 is a second space temperature It, and when the outside temperature Ot is lower than the user's body temperature, the second space temperature It has been raised by the body temperature. The relationship among the outside temperature Ot, the first space temperature Ct, and the second space temperature It is therefore expressed by the following Expression (1).

$$Ot < Ct < It \quad (1)$$

In a case where the outside temperature Ot rapidly lowers with the relationship described above satisfied, the difference between the temperature of the outer side of the windshield 71 (outside temperature Ot) that has been rapidly cooled in accordance with the outside temperature Ot and the first space temperature Ct on the side facing the inner surface of the windshield 71 can be suppressed to a small value because the first space 142 is present between the windshield 71 and the second space 136, whereby occurrence of moisture condensation (dew condensation) in the first space 142 can be suppressed.

In contrast, in a configuration of related art in which no first space 142 is provided, the air having a relatively high temperature inside the second space 136 directly comes into contact with the inner surface of the windshield 71. Therefore, a rapid decrease in the outside temperature Ot increases the difference between the outside temperature Ot and the second space temperature It in the second space 136, with which the inner surface of the windshield 71 having been rapidly cooled in accordance with the outside temperature Ot is in contact, and moisture in the second space 136 is likely to condense on the inner surface of the windshield 71, resulting in dew condensation (fogging).

Further, since the first space 142 is a sealed space, the moisture (water vapor) contained in the second space 136, which is a large-volume internal space in the case (top case 130 and bottom case 33), cannot enter the isolated first space 142, whereby the amount of moisture (water vapor) in the first space 142 can be maintained to be small, and occurrence of dew condensation (fogging) that occurs on the inner surface of the windshield 71 can be suppressed.

The display section 70 is electrically connected to the circuit substrate 45, for example, via a flexible connection substrate 49, which passes through the through hole 176 of the frame 177, and the content displayed in the display section 70 is controlled by the circuit substrate 45.

The parting plate 172 is placed on the front side (side facing windshield 71) of the display section 70 and along the inner circumference of a projecting section 39, which projects inward in the top case 130. In other words, the parting plate 172 is located in the first space 142 between the windshield 71 and the display section 70 and disposed along the outer edge of the display section 70. The parting plate 172 can be made, for example, of stainless steel, aluminum, or brass (copper-zinc alloy) with the surface of the parting plate 172 plated. The parting plate 172 can, for example, be a resin member primarily made of an epoxy resin or an elastic member that functions as a buffer member and a gasket (seal member).

The apparatus body 110 further includes a circumferential recessed section 131, which is located on the side facing the outer edge of the top case 130 and opens toward the front side, as shown in FIGS. 17 and 18. The projecting section 39 is so disposed as to stand along the inner circumference of the recessed section 131. At least part of the bezel 75 is inserted into and fixed to the recessed section 131. Inserting the bezel 75 into the recessed section 131 as described above readily allows positioning of the bezel 75 with respect to the top case 130. The configuration of the bezel 75 is the same as that in the embodiments described above and will not therefore be described in detail.

The windshield 71 is so disposed on the side facing the inner circumferential surface (inner side surface) of the projecting section 39 provided at part of the top case 130 as to line up with the inner circumferential surface of the projecting section 39. The windshield 71 is connected to the inner circumferential surface of the projecting section 39 via the joint member 78. The windshield 71 is so held by the joint member 78 as not to fall off the apparatus body 110 (top case 130). In the present embodiment, a gap is provided between the inner circumferential surface of the overhanging section 75a of the bezel 75 and the windshield 71, but the inner circumferential surface of the overhanging section 75a of the bezel 75 may be in contact with the outer circumferential surface of the windshield 71.

In the above-mentioned wrist apparatus 1A according to the sixth embodiment as a portable electronic apparatus, since the space outside the apparatus body 110 and the second space 136, where the temperature is relatively higher than the temperature in the first space 142, are located via the first space 142, which is a sealed space isolated from the second space 136, the first space 142 serves as a buffer space in a temperature sense, so that the temperature in the second space 136 is not directly equal to the temperature inside the windshield 71. That is, providing the first space 142 prevents the difference in temperature between the spaces outside (ambient air) and inside (first space 142) the windshield 71 from rapidly increasing, whereby the fogging phenomenon due to dew condensation that occurs on the inner surface of the windshield 71 can be suppressed.

Seventh Embodiment

Figure 20:
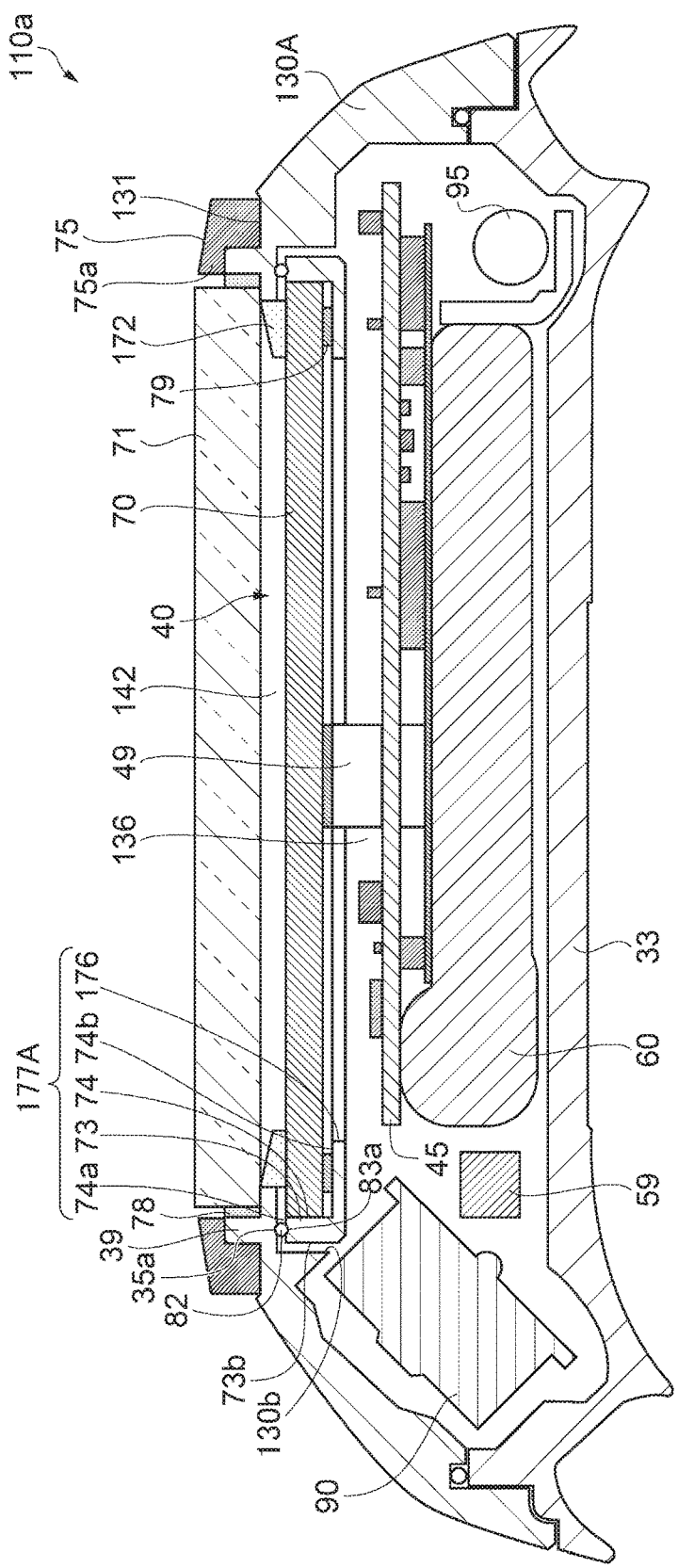
FIG. 20 is a cross-sectional view showing a schematic configuration of a wrist apparatus according to a seventh embodiment and taken along the same line as that in FIG. 17.
Figure 21:
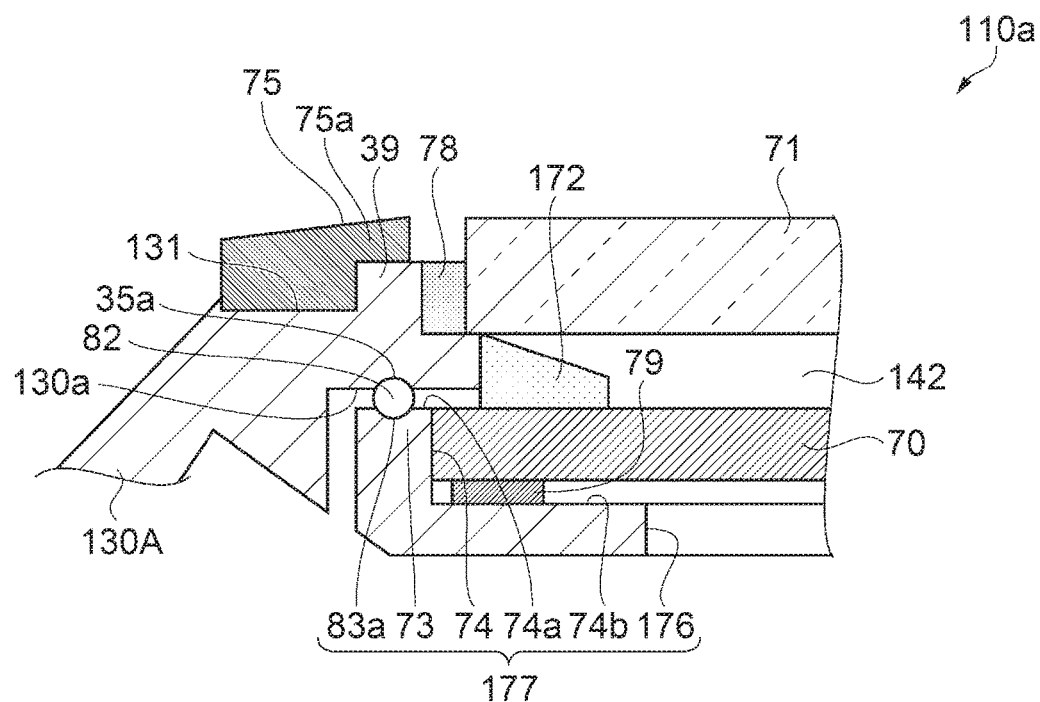
FIG. 21 is a partially enlarged view of FIG. 20 and shows the portion where the second seal member is disposed.

An overview of a wrist apparatus according to a seventh embodiment of the portable electronic apparatus of the aspect of the invention will next be described with reference to FIGS. 20 and 21. FIG. 20 is a cross-sectional view showing a schematic configuration of the wrist apparatus according to the seventh embodiment and taken along the same line as that in FIG. 17. FIG. 21 is a partially enlarged view of FIG. 20 and shows the portion where the second seal member is disposed.

The wrist apparatus according to the seventh embodiment includes an apparatus body 110a in place of the apparatus body 110 of the wrist apparatus 1A. In the apparatus body 110a in the present embodiment, the location where the second seal member 82 is sandwiched differs from the location in the apparatus body 110, and in the apparatus body 110a, a top case 130A is provided in place of the top case 130, and a frame 177A is provided in place of the frame 177.

In the apparatus body 110a, the bottom case 33 and the top case 130A form the case, as shown in FIGS. 20 and 21.

An internal space that is a sealed space inside the case includes the first space 142, which is the space located between the windshield 71 and the display section 70, and the second space 136, which is provided on the side opposite the first space 142 via the display section 70 and the frame 177A.

The frame 177A has the wall section 73, the recessed concave section 74, the inner bottom surface 74b, and the through hole 176. The display section 70 is attached to the frame 177A, specifically, the inner bottom surface 74b, which is located on the side facing the outer circumference of the through hole 176 of the recessed concave section 74, via the circumferential first seal member 79. The first seal member 79 isolates the second space 136 from the front side of the display section 70 (first space 142) via the through hole 176. The frame 177A, to which the display section 70 is attached, is attached to the top case 130 with the annular second seal member 82 sandwiched between a surface 74a, which forms the wall section 73 and faces the windshield 71, and an inner surface 130a (see FIG. 21), which forms the top case 130A and is located on the side opposite the projecting section 39. In other words, since the frame 177A is attached to the top case 130A, the display section 70 is disposed with the first space 142 sandwiched between the display section 70 and the windshield 71.

The first seal member 79 and the second seal member 82 have the same configurations as those in the sixth embodiment and will not therefore be described. The thus disposed first seal member 79 and the second seal member 82 allow the surface 74a, which forms the wall section 73 of the frame 177A and faces the windshield 71, and the inner surface 130a of the top case 130A to be connected to each other in an airtight manner.

The frame 177A is attached, inside the top case 130A, via the second seal member 82 to the inner surface 130a, which forms the top case 130A and is located on the side opposite the projecting section 39. As a result, the space surrounded by the frame 177A, to which the display section 70 is attached via the first seal member 79, the top case 130A, and the windshield 71 forms the first space 142, which is a sealed space separate from the second space 136. In other words, the frame 177A is attached to the inner side of the top case 130A via the second seal member 82 in such a way that the second space 136, which is provided on the side opposite the first space 142 via the display section 70 and the frame 177A, is separate from the first space 142 and the first space 142 forms a sealed space.

A recess is preferably provided in at least one of the inner surface 130a of the top case 130A and the surface 74a of the frame 177A and in a portion that is in contact with the second seal member 82, as shown in FIG. 21, which is an enlarged view. Specifically, in the present form, a first recessed section 35a is provided as the recess in the inner surface 130a of the top case 130A and along the outer edge of the second seal member 82, and a second recessed section 83a is provided as the recess in the surface 74a, which forms the wall section 73 of the frame 177A and faces the windshield 71 and along the outer edge of the second seal member 82.

Providing a recess (first recessed section 35a or second recessed section 83a) in the top case 130A or the frame 177A and in a portion that is in contact with the second seal member 82 allows the frame 177A to be stably held with the second seal member 82 securely positioned, whereby the degree of intimate contact between the second seal member 82 and the top case 130A or the frame 177A can be improved.

The present embodiment can also provide the same advantageous effects as those provided by the sixth embodiment.

In the above-mentioned wrist apparatus 1A (apparatus body 110a) according to the seventh embodiment as a portable electronic apparatus, since the space outside the apparatus body 110a and the second space 136, where the temperature is relatively high, are located via the first space 142, which is a sealed space isolated from the second space 136, the first space 142 serves as a buffer space, so that the temperature in the second space 136 is not directly equal to the temperature inside the windshield 71. That is, providing the first space 142 prevents the difference in temperature between the spaces outside (ambient air) and inside (first space 142) the windshield 71 from rapidly increasing, whereby the dew condensation (fogging) that occurs on the inner surface of the windshield 71 can be suppressed.

The above embodiments have been described with reference to the case where the second seal member 82 is formed, for example, of a rubber gasket or a silicon resin gasket (O ring) as an elastic member having at least one of waterproofness and gas barrier capability and has a circular cross-sectional shape or an arcuate outer shape, but not necessarily. Other examples of the cross-sectional shape of the second seal member 82 formed of an elastic member having at least one of waterproofness and gas barrier capability will be described in the case of the sixth embodiment with reference to the table in FIG. 22. FIG. 22 is a table that lists variations of the cross-sectional shape of the second seal member 82.

The second seal member 82 preferably has the circular cross-sectional shape shown in the embodiments by way of example or is preferably an elliptical second seal member 82*a* labeled with the sample number Sa1 or an oval (track-shaped) second seal member 82*b* labeled with the sample number Sa2 in FIG. 22.

The second seal members 82*a* and 82*b* having the cross-sectional shapes described above allow the contact between the second seal members 82*a*, 82*b* and the top case 130 and between the second seal members 82*a*, 82*b* and the frame 177 to be roughly point contact, which allows concentration of contact force, whereby the intimate contact force (degree of intimate contact) between the components described above can be increased, and the degree of airtightness of the first space 142 can therefore be improved.

The cross-sectional shape of the second seal member 82 is preferably provided with a recessed section in at least one of the surface that is in contact with the top case 130 and the surface that is in contact with the frame 177.

Specifically, a configuration in which protrusion-shaped sections 82*t* are provided at the four corners and recessed sections 82*r* are provided between the protrusion-shaped sections 82*t* can be presented by way of example, such as the configuration of a second seal member 82*c* labeled with the sample number Sa3 in FIG. 22.

Further, a configuration in which recessed sections 82*k* are provided at the four corners can be presented by way of example, such as the configuration of a second seal member 82*d* labeled with the sample number Sa4 in FIG. 22.

Still further, a configuration in which recessed sections 82*m* or 82*n* are provided at two edges of a quadrangle that face each other can be presented by way of example, such as the configuration of second seal members 82*e* and 82*f* labeled with the sample numbers Sa5 and Sa6 in FIG. 22.

The second seal members 82*c*, 82*d*, 82*e*, and 82*f* having the cross-sectional shapes described above are so disposed that the edge provided with the recessed section 82*r*, 82*k*, 82*m*, or 82*n* is in contact with the top case 130 or the frame 177.

Providing any of the second seal members 82*c*, 82*d*, 82*e*, and 82*f* having the recessed sections as described above allows a decrease in the contact area of the contact portion of the second seal member 82*c*, 82*d*, 82*e*, or 82*f*, so that the contact force between the top case 130 or the frame 177 and the second seal members 82*c*, 82*d*, 82*e*, 82*f* can be concentrated on the contact portion, whereby the intimate contact force (degree of intimate contact) between the components described above can be increased, and the degree of airtightness of an intended space can therefore be improved.

Further, the second seal member 82 preferably has a polygonal shape, such as the trapezoidal shape of a second seal member 82*g* labeled with the sample number Sa7 in FIG. 22. Although not shown, the second seal member 82 can, for example, have a rectangular or hexagonal cross-sectional shape.

Employing the polygonal cross-sectional shape of the second seal member 82, such as the trapezoidal cross-sectional shape of the second seal member 82*g* labeled with the sample number Sa7 in FIG. 22, allows stable placement of the second seal member 82, whereby the degree of intimate contact between the second seal member 82 and the top case 130 or the frame 177 can be increased, and the degree of airtightness of the first space 142 can be increased accordingly.

The cross-sectional shape of the second seal member 82 is most preferably the trapezoidal cross-sectional shape of the second seal member 82*g* labeled with the sample number Sa7 in FIG. 22, and employing the trapezoidal second seal member 82*g* allows the second seal member 82*g* to be stably disposed (placed), for example, on the frame 177 and the degree of intimate contact of the second seal member 82*g* and hence the degree of airtightness of the first space 142 to be increased.

The first seal member 79 can also have any of the same cross-sectional shapes of the second seal member 82 described above in the case where the first seal member 79 is formed of an elastic member having waterproofness, for example, a rubber gasket and a silicon resin gasket (O ring).

Since the first space 142 is a sealed space in the apparatus bodies 110 and 110*a* described above, the apparatus bodies 110 and 110*a* can be assembled as follows: For example, when the first space 142 is formed in a low-humidity environment or a reduced-pressure environment, the state of the interior of the first space 142 can be a low-humidity or reduced-pressure state so that a small amount of moisture (water vapor) in the first space 142 can be maintained. As a result, the dew condensation (fogging) that occurs on the inner surface of the windshield 71 can be further effectively suppressed.

Eighth Embodiment

Figure 23:
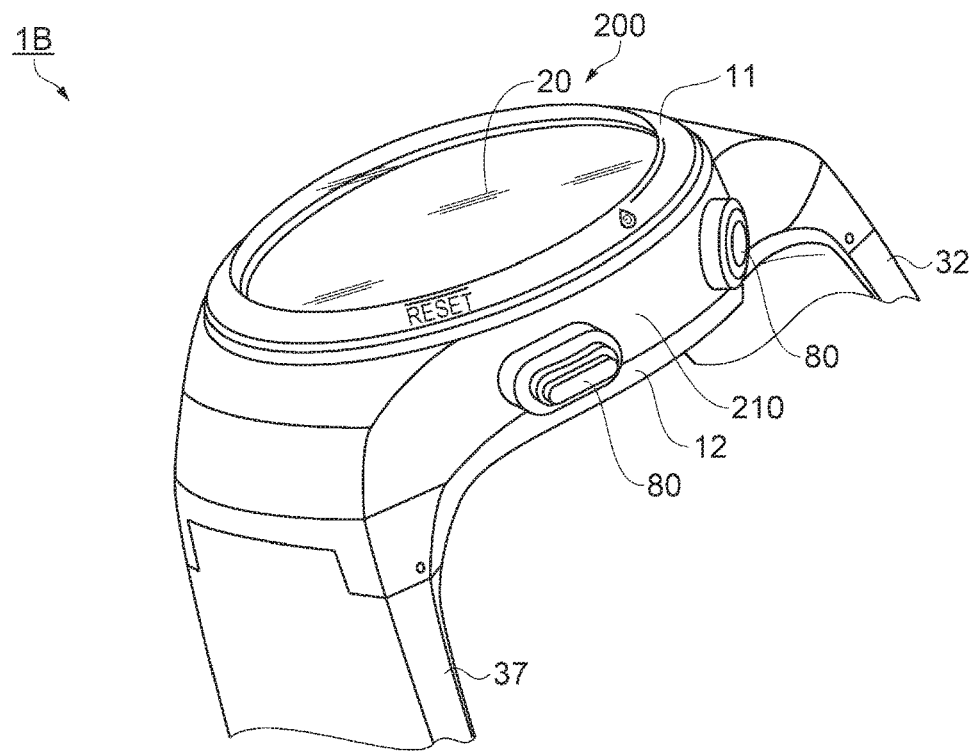
FIG. 23 is a front-side perspective view of a wrist apparatus according to an eighth embodiment of the portable electronic apparatus.
Figure 24:
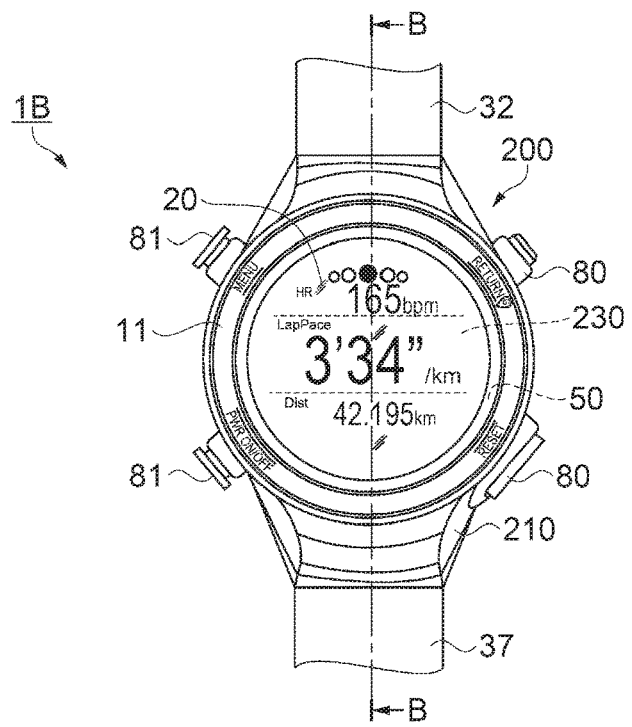
FIG. 24 is a plan view of the wrist apparatus according to the eighth embodiment.
Figure 25:
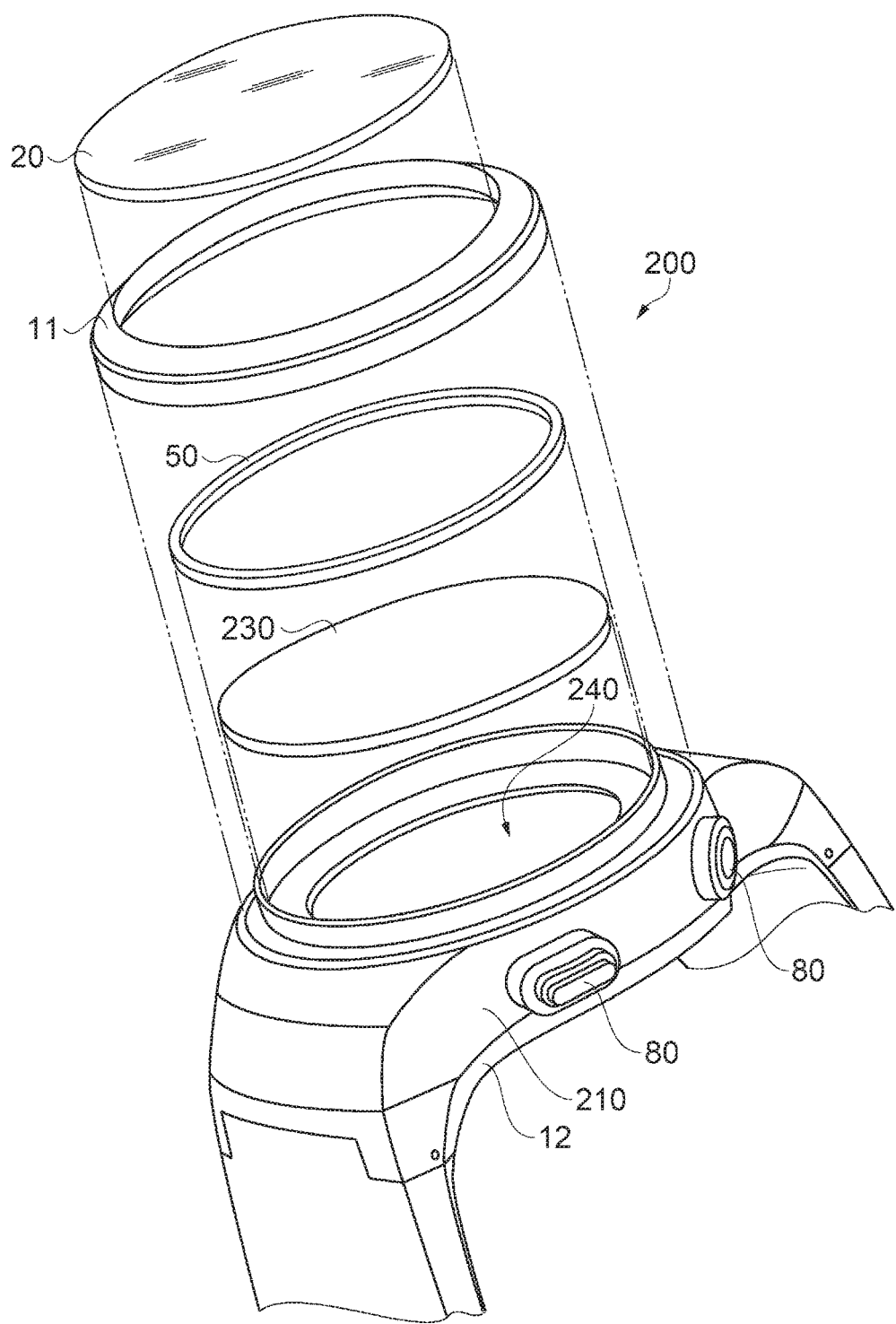
FIG. 25 is an exploded perspective view showing a schematic configuration of the wrist apparatus according to the eighth embodiment.

A wrist apparatus according to an eighth embodiment of the portable electronic apparatus of the aspect of the invention will next be described with reference to FIGS. 23, 24, and 25. FIG. 23 is a front-side perspective view of a wrist apparatus 1B according to the eighth embodiment. FIG. 24 is a plan view of the wrist apparatus 1B according to the eighth embodiment. FIG. 25 is an exploded perspective view showing a schematic configuration of the wrist apparatus 1B according to the eighth embodiment.

As shown in FIGS. 23, 24, and 25, the wrist apparatus 1B as an example of the portable electronic apparatus (wearable electronic apparatus) is worn on a user's (wearer's) given site (wrist, for example) and can detect information on the user's altitude, orientation, and other factors. The wrist apparatus 1B includes an apparatus body 200, which is worn on the user and detect the altitude information, the orientation information, and other pieces of information, and a first band section 32 and a second band section 37, which are attached to the apparatus body 200 and allow the user to wear the apparatus body 200. The wrist apparatus 1B can be provided, for example, with the function of detecting biological information, such as pulse wave information, and the function of acquiring time information as well as the function of detecting the altitude information and the orientation information.

The apparatus body 200 has a bottom case 12 disposed on the side where the wrist apparatus 1B is worn on the user and a top case 210 having an opening section 240 (shown in FIG. 25), which opens toward the front side, disposed on the side opposite the side where the wrist apparatus 1B is worn on the user. The top case 210 and the bottom case 12 forms a case. An electronic circuit, a battery, a variety of sensors, and other electronic parts are accommodated in the apparatus body 200.

A windshield (glass plate in the present example) 20, which is a transparent substrate, is so provided in the opening section 240 located on the front side (top case 210) of the apparatus body 200 as to overlap with a display section 230, which will be described later, in the plan view. The windshield 20 functions as a top plate portion (outer wall) that protects the interior space of the apparatus body 200. A bezel 11 is so provided as to surround the outer circumference of the windshield 20, and the windshield 20 and the bezel 11 are integrated with each other. The bezel 11 can be provided with letters, symbols, and other objects visually recognizable from the front side. Further, the display section 230, which is formed, for example, of a liquid crystal display (LCD), and an annular seal member 50, which seals the space sandwiched between the windshield 20 and the display section 230, are accommodated in positions shifted from the windshield 20 toward the bottom case 12. The plurality of operation buttons 80 and 81 are provided on the front-side (top case 210) side surface of the apparatus body 200 and used to operate a circuit substrate 284, which will be described later.

The apparatus body 200, which has a configuration that allows the user to view information displayed in the display section 230 through the windshield 20, causes the display section 230 to display detected altitude information, orientation information, time information, or a variety of other pieces of information and allows the user to view the displayed information on the front side of the apparatus body 200. Further, a pair of band attaching portions (not shown) that are portions connected to the first band section 32 and the second band section 37 are provided on opposite sides of the bottom case 12.

Figure 26:
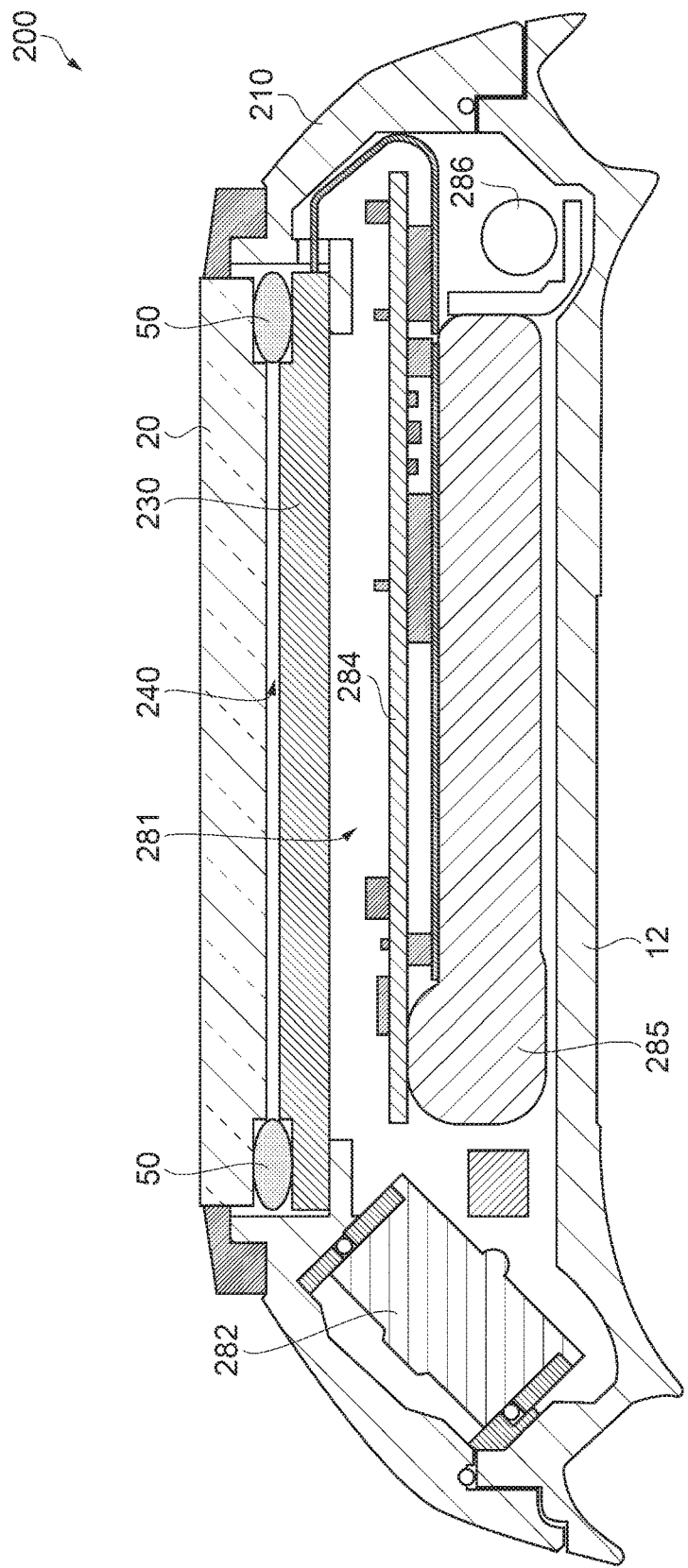
FIG. 26 is a cross-sectional view taken along the line B-B in FIG. 24 and showing the schematic configuration of the wrist apparatus according to the eighth embodiment.
Figure 27:
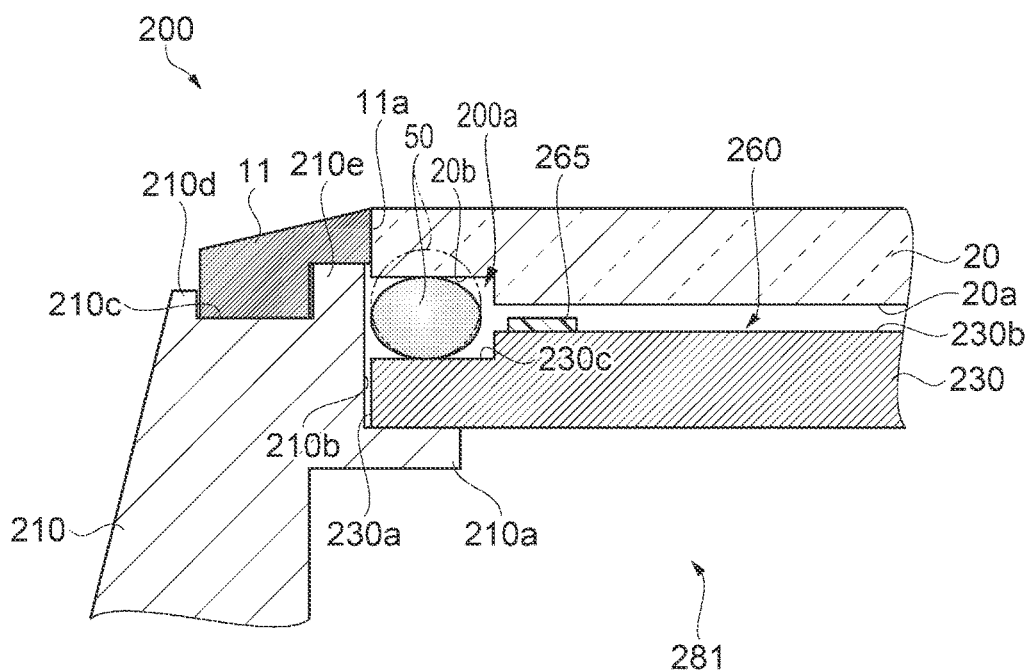
FIG. 27 is a partially enlarged view of FIG. 26.

The cross-sectional structure of the apparatus body 200 of the wrist apparatus 1B according to the eighth embodiment will next be described with reference to FIGS. 26 and 27. FIG. 26 is a cross-sectional view taken along the line B-B in FIG. 24 and showing a schematic configuration of the portable electronic apparatus according to the eighth embodiment. FIG. 27 is a partially enlarged view of FIG. 26 and shows the schematic configuration of the portable electronic apparatus according to the eighth embodiment.

The apparatus body 200 is provided with an apparatus accommodating section 281, which is a sealed space surrounded by the top case 210, the bottom case 12, and the windshield 20, which closes the opening section 240 of the top case 210, as shown in FIG. 26. The apparatus accommodating section 281 accommodate, for example, the circuit substrate 284, a barometric sensor 282, which is an example of a sensor, a secondary battery 285, a vibrator 286, and other electronic parts that are element parts that form the apparatus body 200. The apparatus body 200 does not necessarily have the configuration shown in FIG. 26, and a GPS (global positioning system) antenna, other electronic parts, and other element parts may be added. The display section 230 is disposed on the rear side of the windshield 20, and the seal member 50 is sandwiched between the windshield 20 and the display section 230.

In the apparatus body 200, the display section 230 is accommodated on a surface that forms a projecting section 210a, which protrudes inward in the top case 210, and faces the opening section 240 (front side) and so placed that a clearance is present between the outer circumference 230a of the display section 230 and an inner circumferential surface 210b of the top case 210, as shown in FIG. 27. An inner surface 20a, which is the rear surface of the windshield 20, is so disposed as to face a display surface 230b, which is a surface of the display section 230 and where a variety of pieces of information are displayed. The seal member 50, which has an annular shape, is disposed along the outer edge of the display section 230 and between a stepped section 20b provided as part of the windshield 20 and a stepped section 230c provided as part of the display section 230. That is, the annular seal member 50 is sandwiched between the windshield 20 and the display section 230 to form a sealed space 260. The sealed space 260 is located between the windshield 20 and the apparatus accommodating section 281 so that the air in the apparatus accommodating section 281 does not come into contact with the windshield 20.

The stepped section 20b or 230c as a recess is provided in at least one of the windshield 20 and the display section 230, with which the annular seal member 50 is in contact, and in a portion with which the annular seal member 50 is in contact. The seal member 50 is accommodated in an accommodation section 200a formed by the stepped section 20b of the windshield 20, the stepped section 230c of the display section 230, and the inner circumferential surface 210b of the top case 210.

The cross-sectional shape of the seal member 50 before assembled is indicated by the two-dot chain line. The seal member 50 accommodated in the accommodation section 200a has a cross-sectional shape at least large enough to be pressed by and between the stepped section 20b and the stepped section 230c. The seal member 50 before assembled has a circular or elliptical cross-sectional shape. The seal member 50, when it is assembled in the accommodation section 200a, is pressed by the stepped sections 20b and 230c and therefore elastically deformed. The resultant compressive elastic force of the seal member 50 then allows the seal member 50 to be in intimate contact with the stepped sections 230c and 20b, whereby the space sandwiched between the windshield 20 and the display section 230 is sealed to form the sealed space 260.

The moisture condensation that occurs on the windshield 20 due to a change in the outside temperature will next be described. In the description, an outside temperature $T1$ is the temperature around the apparatus body 200, a space temperature $T2$ is the temperature in the sealed space 260, and an accommodation temperature $T3$ is the temperature in the apparatus accommodating section 281. Even when the outside temperature $T1$ lowers due to a change in the outside environment and the windshield 20 is therefore rapidly cooled, the sealed space 260 provided on the rear side of the windshield 20 allows the difference between the outside temperature $T1$ and the accommodation temperature $T3$ to be small, whereby moisture condensation that occurs on the inner surface 20a of the windshield 20 can be suppressed.

More specifically, the relationship among the outside temperature $T1$, the space temperature $T2$ in the sealed space 260, and the accommodation temperature $T3$ is $T1<T2<T3$ when the outside temperature $T1$ is lower than the wearer's body temperature. When the outside temperature $T1$ rapidly lowers with the relationship satisfied, the moisture condensation that occurs on the inner surface 20a can be suppressed because the difference between the outside temperature $T1$ and the space temperature $T2$ of the space that is in contact with the inner surface 20a of the windshield 20 rapidly cooled in accordance with the outside temperature $T1$ is small. In contrast, in a case where no sealed space 260 is provided, when the outside temperature $T1$ rapidly lowers, windshield 20 is rapidly cooled in accordance with the outside temperature $T1$ because the internal air present in the apparatus accommodating section 281 and heated by the body temperature is in direct contact with the inner surface 20a, and the difference between the outside temperature $T1$ and the accommodation temperature $T3$ in the space with which the inner surface 20a is in contact increases, resulting in condensation of the moisture in the apparatus accommodating section 281, and dew condensation occurs on the inner surface 20a.

The top case 210 has a circumferential recessed section 210c, which is located on the side facing the outer edge of the top case 210 and opens toward the front side. The recessed section 210c has a first wall section 210d provided on the side facing the outer circumference of the top case 210 and a second wall section 210e provided on the side facing the inner circumference of the top case 210. At least part of the bezel 11 is inserted into and fixed to the recessed section 210c. Inserting the bezel 11 into the recessed section 210c as described above readily allows positioning of the bezel 11 with respect to the top case 210.

The bezel 11 has an overhanging section 11a, which overhangs toward the windshield 20. The windshield 20 is so disposed on the side facing the inner circumferential surface (inner side surface) of the overhanging section 11a of the bezel 11 as to line up with the bezel 11. The overhanging section 11a may be in contact with the top of the inner-circumferential-side second wall section 210e of the top case 210. Causing the overhanging section 11a to be in contact with the top of the second wall section 210e of the top case 210 allows decrease in deformation of the overhanging section 11a.

The windshield 20 is so disposed as to be in contact with the inner side surface of the overhanging section 11a of the bezel 11. The windshield 20 is so held by the bezel 11 as not to fall off the apparatus body 200 (top case 210).

The top case 210 and the bottom case 12 only needs to be made of a material that allows the apparatus accommodating section 281 to accommodate electronic parts and is preferably made of a plastic material, which has excellent productivity and readily provides a structure that holds a variety of sensors. The bezel 11 may be made, for example, of stainless steel or brass (copper-zinc alloy) with the surface of the bezel 11 plated. The windshield 20 is not limited to a glass plate and can be made of a transparent plastic material other than glass as long as the resultant member is a transparent member that allows the user to view the display section 230 and has strength large enough to protect the liquid crystal display (LCD) that forms the display section 230 and other components accommodated in the top case 210 and the bottom case 12.

The seal member 50 only needs to be an elastic member having waterproofness and is preferable made, for example, of NBR (nitrile rubber) or IIR (isobutylene isoprene rubber) typically used as a seal member for a portable electronic apparatus.

The liquid crystal display (LCD) that forms the display section 230 displays, for example, altitude information obtained by using a barometric sensor, temperature information obtained by using an air temperature sensor, position information obtained by using a GPS sensor and a geomagnetism sensor, motion information, such as the travel and the amount of motion, the latter of which is obtained by using an angular velocity sensor, an acceleration sensor, or any other sensor, and time information, such as current time in accordance with a variety of detection modes. The user can view (visually recognize) displayed pieces of the information described above through the windshield 20.

The humidity (the amount of moisture) in the sealed space 260 can be lowered by assembling the sealed space 260 in an environment where the humidity (the amount of moisture) is managed to be a small value. Instead, the sealed space 260 may be assembled in an environment filled with an inert gas, such as nitrogen, helium, or argon, so that the sealed space 260 is filled with the inert gas to achieve a low-humidity (moisture) state. Further, the humidity (the amount of moisture) in the sealed space 260 can be lowered by configuring the sealed space 260 to have a reduced-pressure atmosphere. Keeping the humidity in the sealed space 260 at a small value allows suppression of occurrence of moisture condensation even in the case where the windshield 20 is rapidly cooled because the humidity in the sealed space 260, which is in contact with the inner surface 20a, is low.

A hygroscopic member 265 may be disposed in the sealed space 260, which is formed by the windshield 20 and the display section 230. The hygroscopic member 265 can be made, for example, of a material containing polyacrylate fibers and can absorb moisture (damp). As a preferable example in which the hygroscopic member 265 is disposed, the hygroscopic member 265, which is formed in an annular shape, is fixed to the display surface 230b, for example, with an adhesive, as shown in FIG. 27. The thus arranged hygroscopic member 265 can absorb damp (moisture) in the sealed space 260 and lower the humidity, whereby occurrence of condensation of moisture encapsulated in the sealed space 260 can be suppressed even when the windshield 20 is rapidly cooled.

As described above, the space formed by the windshield 20 and the display section 230 is sealed by elastically deforming the annular seal member 50 to form the sealed space 260 in the apparatus accommodating section 281, and the thus formed sealed space 260 can reduce the difference between the outside temperature T1 and the accommodation temperature T3. Reducing the difference between the outside temperature T1 and the space temperature T2 can prevent moisture condensation that occurs on the inner surface 20a of the windshield 20 and hence prevent occurrence of fogging even when the outside temperature T1 rapidly changes.

Further, even when the windshield 20 is rapidly cooled, the moisture condensation can be effectively avoided and the occurrence of dew condensation can be suppressed by assembling the sealed space 260 in a low-humidity environment or disposing the hygroscopic member 265 in the sealed space 260 to achieve a low-humidity environment in the sealed space 260.

Variations of the apparatus body 200 according to the eighth embodiment will be described below with reference to the drawings. In the variations, the same components as those of the apparatus body 200 according to the eighth embodiment have the same reference characters and will not be described.

Variation 1

Figure 28:
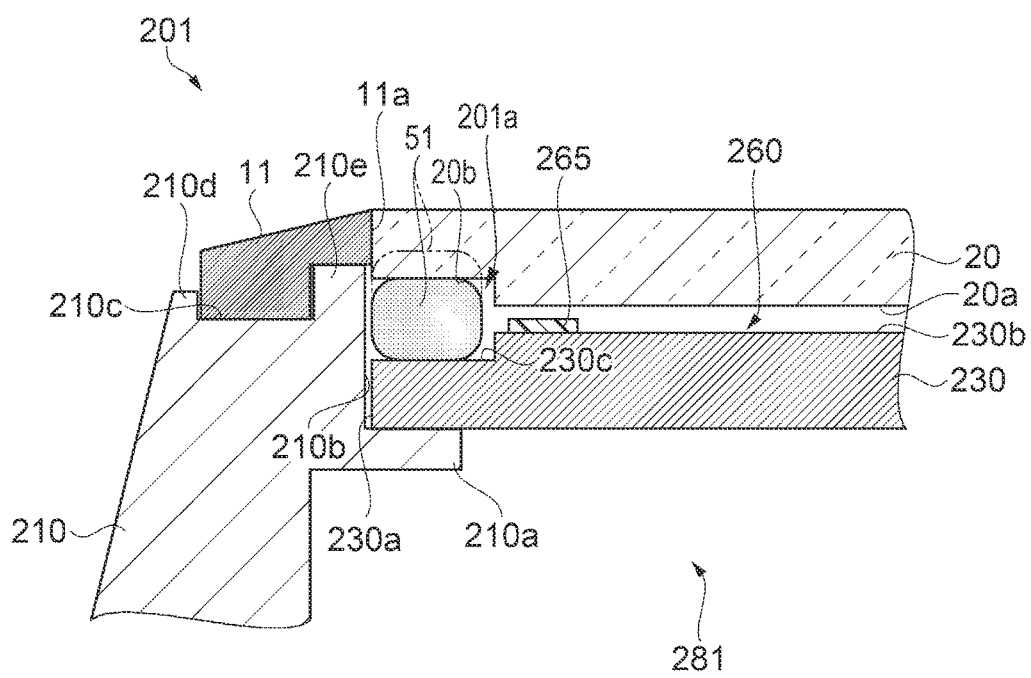
FIG. 28 shows Variation 1 of the annular seal member and is a partially enlarged view corresponding to FIG. 27.

As a variation of the apparatus body 200 according to the eighth embodiment, an apparatus body 201 according to Variation 1 will be described with reference to FIG. 28. FIG. 28 is a partially enlarged view of the apparatus body 201. The apparatus body 201 according to the present variation differs from the apparatus body 200 according to the eighth embodiment in that a seal member 51 has a different cross-sectional shape.

In the apparatus body 201 according to Variation 1, the space formed by the windshield 20 and the display section 230 is sealed by the seal member 51 to form the sealed space 260. The seal member 51 is accommodated in an accommodation section 201a formed by the inner circumferential surface 210b of the top case 210, the stepped section 20b of the windshield 20, and the stepped section 230c of the display section 230. The annular seal member 51 has an oval or rectangular cross-sectional shape having a longitudinal direction parallel to the display surface 230b. FIG. 28 shows an example of the seal member 51 having a rectangular cross-sectional shape.

The shape of the seal member 51 before assembled in the case is indicated by the two-dot chain line. The seal member 51 accommodated in the accommodation section 201a has a cross-sectional shape at least large enough to be pressed by and between the stepped sections 20b and 230c. The seal member 51, when assembled in the accommodation section 201a, is pressed by the stepped sections 20b and 230c and therefore elastically deformed.

Forming the seal member 51 in an oval or rectangular shape and disposing the seal member 51 in such a way that the longitudinal direction of the oval or the rectangular shape is parallel to the display surface 230b allows an increase in the area where the stepped sections 20b and 230c are in contact with the seal member 51.

Variation 2

Figure 29:
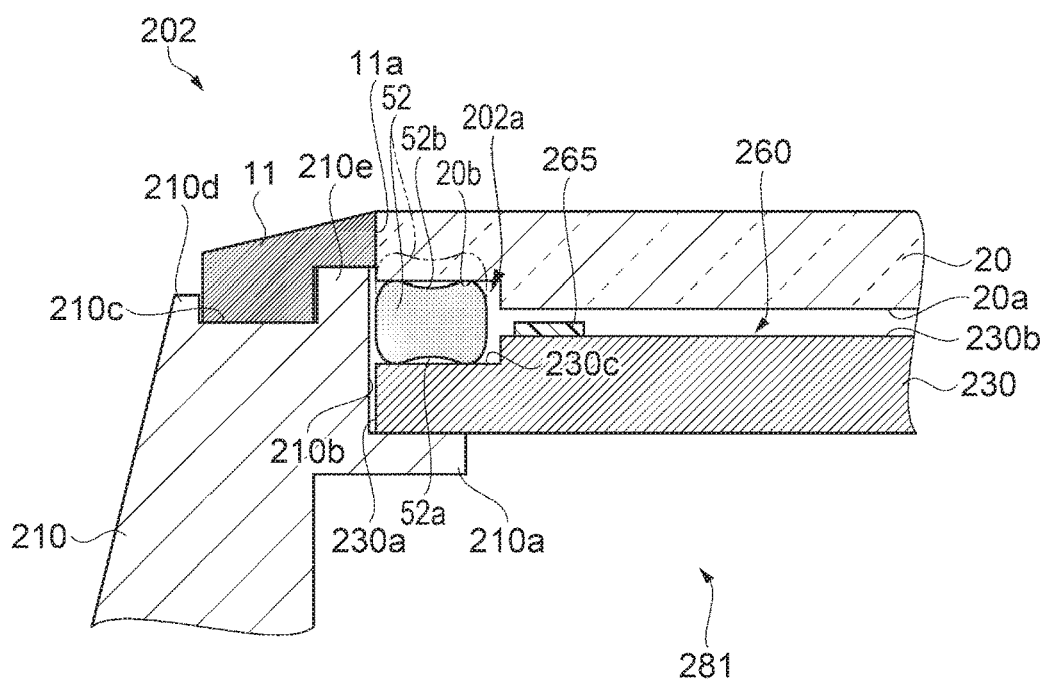
FIG. 29 shows Variation 2 of the annular seal member and is a partially enlarged view corresponding to FIG. 27.

As a variation of the apparatus body 200 according to the eighth embodiment, an apparatus body 202 according to Variation 2 will be described with reference to FIG. 29. FIG. 29 is a partially enlarged view of the apparatus body 202. The apparatus body 202 according to the present variation differs from the apparatus body 200 according to the eighth embodiment in that a seal member 52 has a different cross-sectional shape.

The cross-sectional shape of the seal member 52 according to Variation 2 has a recessed section 52a, which is provided in a central portion of the rear surface which forms the seal member 52 and with which the stepped section 230c of the display section 230 is in contact, and a recessed section 52b, which is provided in a central portion of the front surface which forms the seal member 52 and with which the stepped section 20b of the windshield 20 is in contact. The recessed section 52a is formed in the rear surface, with which the stepped section 230c is in contact, over the entire circumference, and the recessed section 52b is formed in the front surface, with which the stepped section 20b is in contact, over the entire circumference. In the present variation, the recesses are provided in the front and rear sides of the seal member 52, but not necessarily, and a recess may be provided in one of the front and rear sides of the seal member 52. The seal member 52 is accommodated in an accommodation section 202a formed by the inner circumferential surface 210b, the stepped section 20b, and the stepped section 230c.

The shape of the seal member 52 before assembled in the case is indicated by the two-dot chain line. The seal member 52 accommodated in the accommodation section 202a has a cross-sectional shape at least large enough to be pressed by and between the stepped sections 20b and 230c. When the seal member 52 is assembled in the accommodation section 202a, the corners of the seal member 52, which are formed because the recessed sections 52a and 52b are provided, are pressed by the stepped sections 20b and 230c and therefore elastically deformed. When the corners of the seal member 52 are elastically deformed, compressive elastic force is produced at and concentrated at the corners, whereby the degree of intimate contact of the seal member 52 can be increased.

Variation 3

Figure 30:
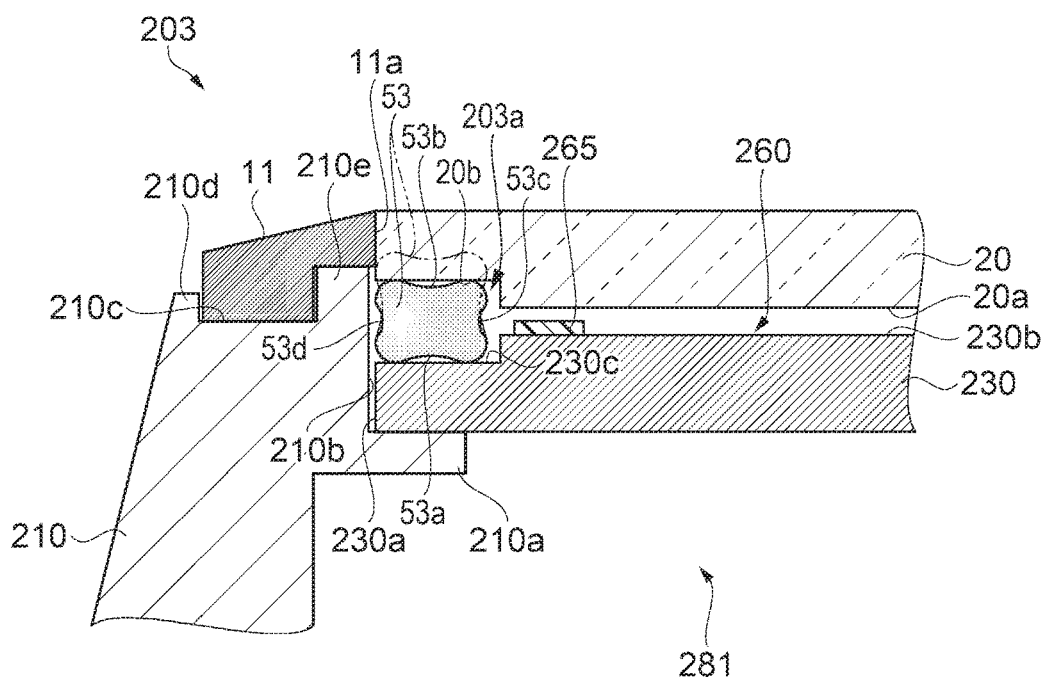
FIG. 30 shows Variation 3 of the annular seal member and is a partially enlarged view corresponding to FIG. 27.

As a variation of the apparatus body 200 according to the eighth embodiment, an apparatus body 203 according to Variation 3 will be described with reference to FIG. 30. FIG. 30 is a partially enlarged view of the apparatus body 203. The apparatus body 203 according to the present variation differs from the apparatus body 200 according to the eighth embodiment in that a seal member 53 has a different cross-sectional shape.

The cross-sectional shape of the seal member 53 according to Variation 3 has a recessed section 53a, which is provided in a surface which forms the seal member 53 and with which the stepped section 230c of the display section 230 is in contact, and a recessed section 53b, which is provided in a surface which forms the seal member 53 and with which the stepped section 20b of the windshield 20 is in contact. The outer circumferential surface of the seal member 53 faces the inner circumferential surface 210b of the top case 210, a recessed section 53d is provided in the outer circumferential surface over the entire circumference, and a recessed section 53c is provided in the inner circumferential surface opposite the outer circumferential surface over the entire circumference. The seal member 53 is accommodated in an accommodation section 203a formed by the inner circumferential surface 210b, the stepped section 20b, and the stepped section 230c.

The shape of the seal member 53 before assembled in the case is indicated by the two-dot chain line. The seal member 53 accommodated in the accommodation section 203a has a cross-sectional shape at least large enough to be pressed by and between the stepped sections 20b and 230c. That is, since the four edges that form the cross section of the seal member 53 are provided with the respective recessed sections 53a, 53b, 53c, and 53d, the corners of the cross section each have a projecting shape, and when the seal member 53 is accommodated in the accommodation section 203a, elastic deformation concentrates on the projecting sections at the corners.

As described above, providing the seal member 53 with the recessed sections 53a, 53b, 53c, and 53d allows formation of the projecting sections at the corners of the seal member 53, and the stepped sections 20b and 230c cause elastic deformation to concentrate on the projecting portions. Compressive elastic force resulting from the elastic deformation increases the degree of intimate contact of the seal member 53, whereby the airtightness of the sealed space 260 can be improved.

Variation 4

Figure 31:
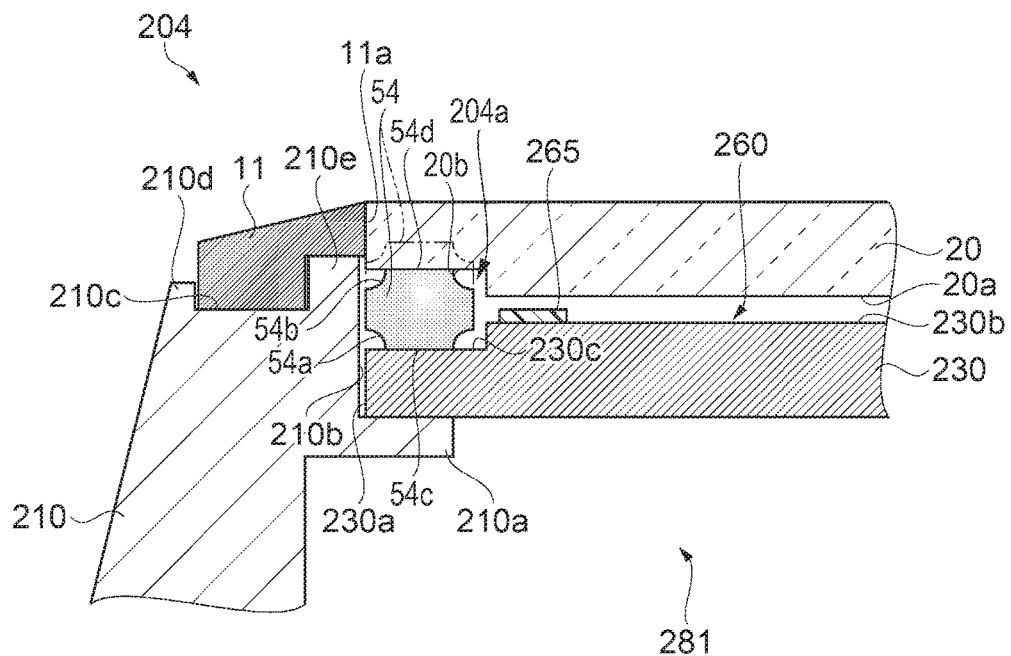
FIG. 31 shows Variation 4 of the annular seal member and is a partially enlarged view corresponding to FIG. 27.

As a variation of the apparatus body 200 according to the eighth embodiment, an apparatus body 204 according to Variation 4 will be described with reference to FIG. 31. FIG. 31 is a partially enlarged view of the apparatus body 204. The apparatus body 204 according to the present variation differs from the apparatus body 200 according to the eighth embodiment in that a seal member 54 has a different cross-sectional shape.

The seal member 54 according to Variation 4 has a rectangular cross-sectional shape with recessed corners, and the shape of the seal member 54 before assembled in the case is indicated by the two-dot chain line. The seal member 54 is accommodated in an accommodation section 204a formed by the inner circumferential surface 210b, the stepped section 20b, and the stepped section 230c. The seal member 54 accommodated in the accommodation section 204a has a cross-sectional shape at least large enough to be pressed by and between the stepped sections 20b and 230c. That is, the front corners that form the seal member 54 and are in contact with the stepped section 20b are each provided a recessed section 54b, and the rear corners that form the seal member 54 and are in contact with the stepped section 230c are each provided a recessed section 54a. When the seal member 54 is accommodated in the accommodation section 204a, a central section 54c, which forms the seal member 54 and is located between the two recessed sections 54a, comes into contact with the stepped section 230c, and a central section 54d, which forms the seal member 54 and is sandwiched between the two recessed sections 54b, comes into contact with the stepped section 20b. In the present variation, the recesses are provided at the front and rear corners of the seal member 54, but not necessarily, and recesses may be provided at the front corners or the rear corners of the seal member 54.

The shape of the seal member 54 before assembled in the case is indicated by the two-dot chain line. When the seal member 54 is accommodated in the accommodation section 204a, the seal member 54 is pressed by the stepped sections 20b and 230c and therefore elastically deformed. Since the central sections 54c and 54d are partially deformed because the recessed sections 54a and 54b are provided, the resultant compressive elastic force is concentrated on the central sections 54c and 54d, whereby the degree of intimate contact of the seal member 54 with the windshield 20 and the display section 230 can be increased.

Variation 5

Figure 32:
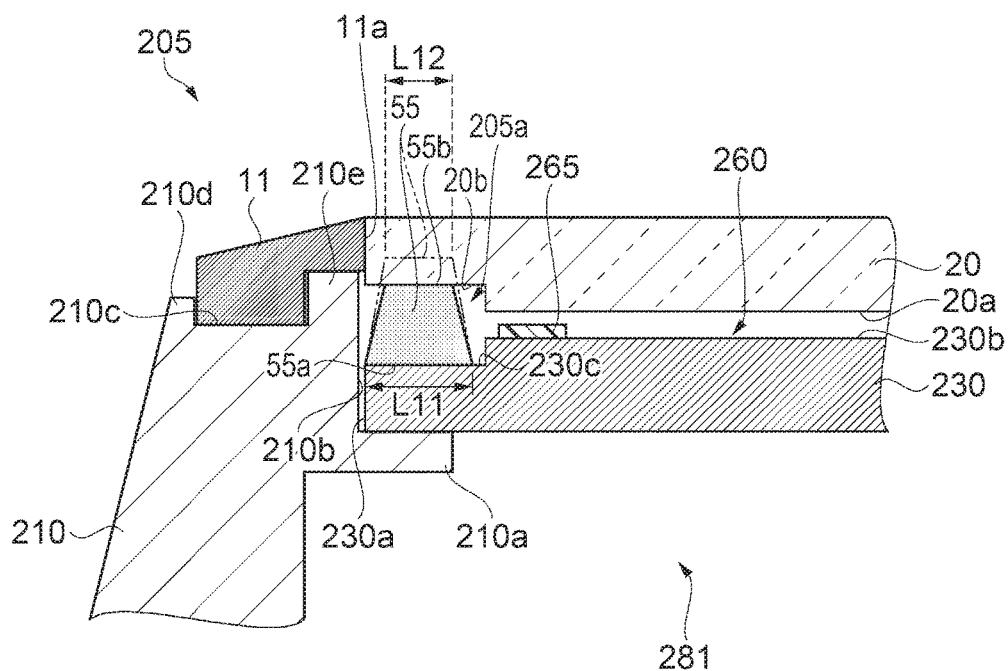
FIG. 32 shows Variation 5 of the annular seal member and is a partially enlarged view corresponding to FIG. 27.

As a variation of the apparatus body 200 according to the eighth embodiment, an apparatus body 205 according to Variation 5 will be described with reference to FIG. 32. FIG. 32 is a partially enlarged view of the apparatus body 205. The apparatus body 205 according to the present variation differs from the apparatus body 200 according to the eighth embodiment in that a seal member 55 has a different cross-sectional shape.

The seal member 55 according to Variation 5 has a trapezoidal cross-sectional shape, which is formed of an end surface 55b, which is in contact with the stepped section 20b of the windshield 20, an end surface 55a, which is in contact with the stepped section 230c of the display section 230, and side surfaces that connect the end surface 55a and the end surface 55b to each other. In the present variation, the seal member 55 has a trapezoidal shape that satisfies L11>L12, where L11 represents the length of the end surface 55a and L12 represents the length of the end surface 55b. The cross-sectional shape of the seal member 54 is not necessarily configured as described above and may have a trapezoidal shape that satisfies L11<L12 or the reversed relationship between the lengths L11 and L12. The seal member 55 is accommodated in an accommodation section 205a formed by the inner circumferential surface 210b, the stepped section 20b, and the stepped section 230c.

The shape of the seal member 55 before assembled in the case is indicated by the two-dot chain line. When the seal member 55 is accommodated in the accommodation section 205a, the seal member 55 is pressed by the stepped sections 20b and 230c and therefore elastically deformed. Since the contact area where the end surface 55b is in contact with the stepped section 20b is small, the elastic deformation concentrates on the end surface 55b so that the resultant compressive elastic force increases, whereby the degree of intimate contact between the stepped section 20b and the seal member 55 can be increased. Further, since the end surface 55a is formed in correspondence with the stepped section 230c, the stepped section 20b and the end surface 55b are allowed to be stably in intimate contact with each other.

Variation 6

Figure 33:
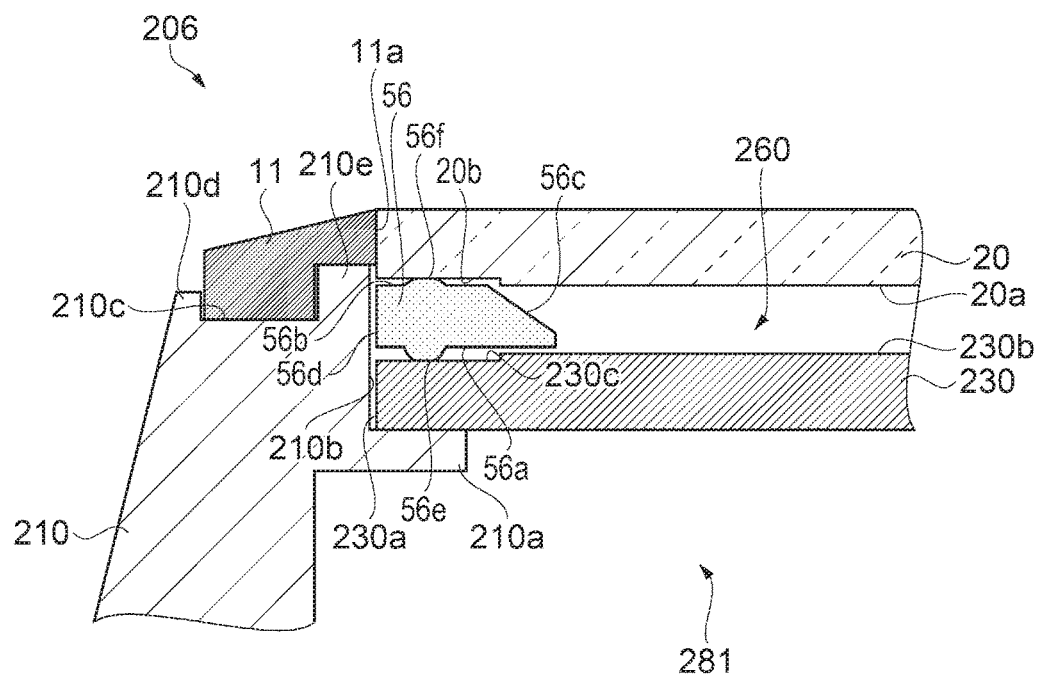
FIG. 33 shows Variation 6 of the annular seal member and is a partially enlarged view corresponding to FIG. 27.

As a variation of the apparatus body 200 according to the eighth embodiment, an apparatus body 206 according to Variation 6 will be described with reference to FIG. 33. FIG. 33 is a partially enlarged view of the apparatus body 206. The apparatus body 206 according to the present variation differs from the apparatus body 200 according to the eighth embodiment in that a seal member 56 has a different cross-sectional shape.

The cross-sectional shape of the seal member 56 according to Variation 6 has an end surface 56a, which is so disposed as to face the stepped section 230c of the display section 230, and an end surface 56b, which is so disposed as to face the stepped section 20b of the windshield 20, and an outer circumferential surface 56d, which is so disposed as to face the inner circumferential surface 210b of the top case 210, and an inner circumferential surface 56c, which is so formed as to incline with respect to the end surface 56a, are formed along the entire end surfaces 56a and 56b. In other words, the seal member 56 has a cross-sectional shape that causes the thickness thereof increases from the inner circumference to the outer circumference, and the seal member 56 therefore serves as a parting plate.

The end surface 56a is provided with a projection 56e, which projects toward the stepped section 230c, and the projection 56e is in contact with the stepped section 230c. Further, the end surface 56b is provided with a projection 56f, which projects toward the stepped section 20b, and the projection 56f is in contact with the stepped section 20b. When the seal member 56 is assembled in the top case 210, the stepped section 20b presses the projection 56f, and the stepped section 230c presses the projection 56e, so that the projections 56e and 56f are elastically deformed. When the projections 56e and 56f are elastically deformed, compressive elastic force is produced, whereby the space formed by the windshield 20 and the display section 230 is sealed to form the sealed space 260.

In the configuration described above, since the inner circumferential surface 56c of the seal member 56 is formed of an inclining surface, the function of a parting plate can be added to the seal member 56, and the thus configured seal member 56 can be used to form the sealed space 260 with no feeling of wrongness in the exterior appearance of the apparatus body 206. Further, differentiating a color tone of the seal member 56 from that of the top case 210 allows the seal member 56 to be used as an accent in terms of exterior appearance, whereby the exterior appearance of the apparatus body 206 can be improved.

The variations of the cross-sectional shape of the seal member have been described above, and the same advantageous effects provided by the eighth embodiment can be provided also by the configurations of the variations. Further, the cross-sectional shape of the seal member is not limited to the shapes described above as long as the airtightness of the sealed space 260 is ensured.

Ninth Embodiment

Figure 34:
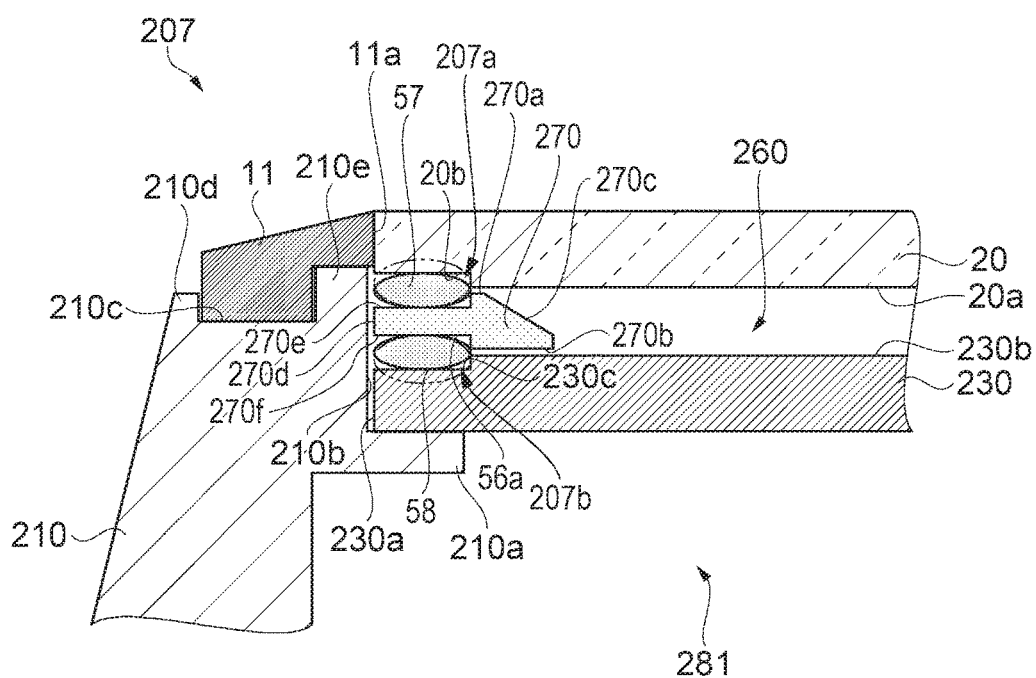
FIG. 34 shows a schematic configuration of a wrist apparatus according to a ninth embodiment and is a partially enlarged view corresponding to FIG. 27.

An apparatus body 207 according to a ninth embodiment will be describe with reference to FIG. 34. FIG. 34 is a partially enlarged view of the apparatus body 207. The apparatus body 207 according to the present embodiment differs from the apparatus body 200 according to the eighth embodiment in that a first seal member 57 as a first annular member, a second seal member 58 as a second annular member, and a parting plate 270 are provided.

The apparatus body 207 is provided with the apparatus accommodating section 281, which is a sealed space surrounded by the top case 210, the bottom case 12 (not shown), and the windshield 20, which closes the opening section 240 (not shown) of the top case 210, as shown in FIG. 34. The apparatus accommodating section 281 includes the parting plate 270 disposed between the windshield 20 and the display section 230 and along the outer edge of the display section 230. The first seal member 57 is disposed between the windshield 20 and the surface that forms the parting plate 270 and faces the windshield 20, and the second seal member 58 is disposed between the display section 230 and the surface that forms the parting plate 270 and faces the display section 230. Further, the apparatus accommodating section 281 accommodates element parts that form the apparatus body 207, such as those shown in FIG. 26, and they are the same as those in the eighth embodiment and will not therefore be described.

The parting plate 270 is disposed between the display section 230 and the windshield 20, a lower surface 270b of the parting plate 270 is so formed as to face the display surface 230b, and a stepped section 270f is so formed on the side facing the outer circumference of the lower surface 270b as to face the stepped section 230c. An upper surface 270a is so formed on the side opposite the lower surface 270b as to face the inner surface 20a of the windshield 20, and a stepped section 270e is so formed on the side facing the outer circumference of the upper surface 270a as to face the stepped section 20b of the windshield 20. An outer circumferential surface 270d, which is so disposed as to face the inner circumferential surface 210b of the top case 210, is provided along the entire stepped sections 270e and 270f, and an inner circumferential section 270c, which is so formed as to incline with respect to the lower surface 270b, is formed along the entire upper surface 270a and lower surface 270b.

The shapes of the first seal member 57 and the second seal member 58 before assembled are indicated by the two-dot chain lines. The first seal member 57 and the second seal member 58 each have a circular or elliptical cross-sectional shape. The first seal member 57 is accommodated in an accommodation section 207a formed by the stepped section 20b, the stepped section 270e, and the inner circumferential surface 210b, pressed by the stepped sections 20b and 270e, and therefore elastically deformed. The second seal member 58 is accommodated in an accommodation section 207b formed by the stepped section 230c, the stepped section 270f, and the inner circumferential surface 210b, pressed by the stepped sections 230c and 270f, and therefore elastically deformed. When the first seal member 57 and the second seal member 58 are elastically deformed via the parting plate 270, the resultant compressive elastic force seals the space formed by the windshield 20 and the display section 230 for formation of the sealed space 260.

In the present embodiment, the windshield 20 is provided with the stepped section 20b and the parting plate 270 is provided with the stepped section 270e in correspondence with the first seal member 57 to form the accommodation section 207a, but not necessarily, and the accommodation section 207a may instead be formed by using one of stepped sections of the windshield 20 and the parting plate 270. That is, the accommodation section 207a may be formed by the stepped section 270e and the inner surface 20a or may be formed by the stepped section 20b and the upper surface 270a. Similarly, the accommodation section 207b may be formed by using one of the stepped sections of the display section 230 and the parting plate 270. That is, the accommodation section 207b may be formed by the stepped section 270f and the display surface 230b or may be formed by the lower surface 270b and the stepped section 230c.

The parting plate 270 can be made, for example, of a metal primarily containing aluminum, stainless steel, brass (copper-zinc alloy), or any other material or can be made of a UV-curing transparent resin material (member made of resin), such as urethane acrylate, acrylic resin acrylate, and epoxy acrylate. When the parting plate 270 is made of a metallic material, a quality appearance can be added to the portion around the display section 230, and the strength of the parting plate 270 can be increased. When the parting plate 270 is made of a resin material, the parting plate 270 can be readily shaped by using molding cure achieved, for example, by ultraviolet light, and an increasing number of various shapes can be readily handled.

The first seal member 57 and the second seal member 58 each do not necessarily have the elliptical cross-sectional shape shown in FIG. 34 and may have any shape that allows the sealed space 260 to be achieved. For example, the first seal member 57 and the second seal member 58 can each have an oval, rectangular, or trapezoidal cross-sectional shape.

Figure 35:
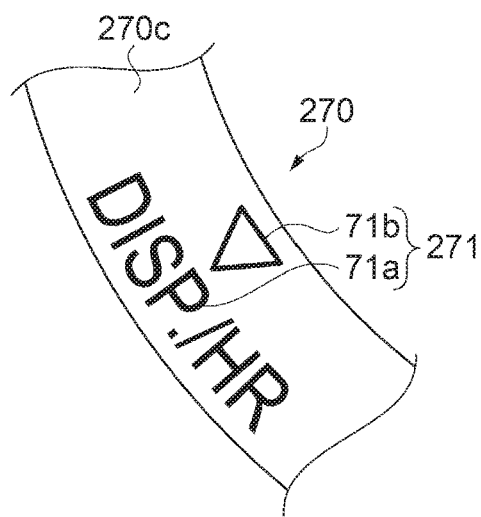
FIG. 35 is a partial plan view showing an example of information displayed on a parting plate according to the ninth embodiment.

FIG. 35 shows an embodiment in which the inner circumferential section 270c of the parting plate 270 of the apparatus body 207 is provided with displayed information 271. FIG. 35 is a partial plan view of the apparatus body 207. The displayed information 271 can, for example, include letters 71a, a symbol (pictorial letter) 71b, and markings that are not shown. The displayed information 271 may, for example, be at least one of the letters 71a, the symbol (pictorial letter) 71b, and the markings (not shown). Further, the color tone of the displayed information 271 may be changed, or a pattern may be displayed as the displayed information 271. As described above, the exterior appearance of the apparatus body 207 can be improved by providing the parting plate 270 with the displayed information 271, such as letters, a pattern, or any other object.

As described above, the parting plate 270 is disposed between the windshield 20 and the display section 230 to form a space, and the space is sealed by the first seal member 57 and the second seal member 58 to form the sealed space 260, whereby the difference between the outside temperature T1 and the accommodation temperature T3 in the apparatus accommodating section 281 can be reduced. Even if the outside temperature T1 rapidly lowers, and the temperature of the inner surface 20a of the windshield 20 therefore lowers, the difference between the outside temperature T1 and the space temperature T2 in the sealed space 260, which in in contact with the inner surface 20a, is small, whereby moisture condensation that occurs on the inner surface 20a can be prevented, and occurrence of fogging that occurs on the inner surface 20a can be suppressed.

Further, since the inner circumferential section 270c of the parting plate 270 can be provided with the displayed information 271, the functions of the operation buttons can be displayed, and information can be displayed in concert with display of the contents displayed in the display section 230. Using a metallic material as the material of the parting plate 270 allows a quality appearance to be added, whereby the exterior appearance can be improved.

Figure 36:
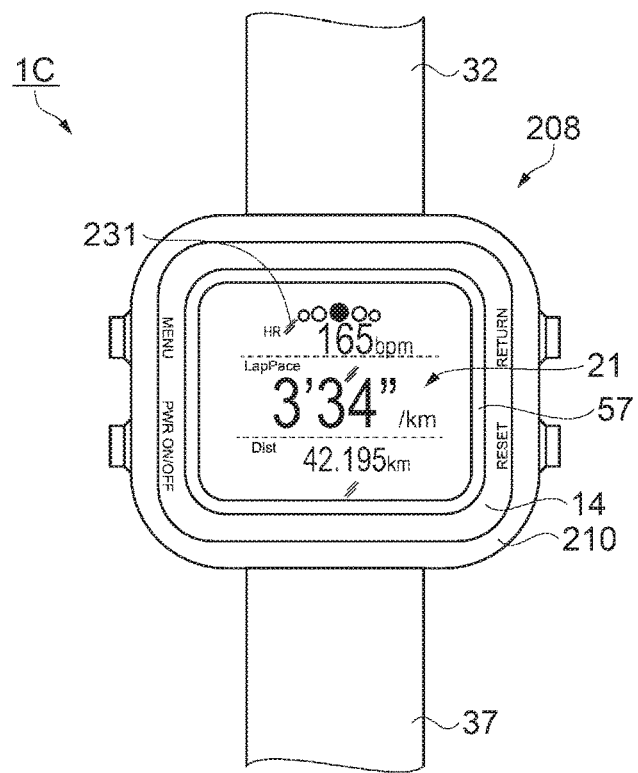
FIG. 36 is a plan view of a wrist apparatus according to the ninth embodiment.

The description of the present embodiment has been made with reference to the case where the display section 230 has a circular plan shape, but not necessarily, and the display section 230 may, for example, have an oblong or elliptical plan shape. A variation showing a display section 231 having a rectangular plan shape will be described with reference to FIG. 36. FIG. 36 is a plan view of a wrist apparatus 1C including an apparatus body 208. The apparatus body 209 according to the present example differs from the apparatus body 207 according to the ninth embodiment in terms of the plan shape of the display section.

The wrist apparatus 1C according to the present variation includes the apparatus body 208. In the apparatus body 208, a rectangular windshield 21 is formed along the plan shape of the display section 231, and the first seal member 57 is disposed along the outer edge of the display section 231. The sealed space 260 (not shown) is thus formed. A bezel 14 is formed along the outer circumference of the windshield 21.

As described above, even when the display section 231 has an oblong or elliptical plan shape, forming the first seal member 57 along the outer edge of the display section 231 allows the space formed by the windshield 21 and the display section 231 to be sealed, whereby fogging that occurs on the inner surface of the windshield 21 can be suppressed.

Further, in the above description, a wrist apparatus worn around a user's (wearer's) wrist has been described by way of example of a portable electronic apparatus worn on a given site of the user. Instead, the following examples showing how the user wears the wrist apparatus can be presented: For example, the portable electronic apparatus may be a neckless-shaped apparatus worn around the neck; may be worn, for example, on the torso or around an ankle, or may be held in the user's pocket or bag, as in the case of a personal digital assistance.

The above description has been made by using a GPS (Global Positioning System) as a global navigation satellite system, and another global navigation satellite system (GNSS) may instead be used. For example, one of or two or more of EGNOS (European Geostationary-Satellite Navigation Overlay Service), QZSS (Quasi Zenith Satellite System), GLONASS (GLObal NAvigation Satellite System), GALILEO, BeiDou (BeiDou Navigation Satellite System), and other global navigation satellite systems may be used. Further, WAAS (Wide Area Augmentation System), EGNOS (European Geostationary-Satellite Navigation Overlay Service), or any other satellite-based augmentation system (SBAS) may be used as at least one of the global navigation satellite systems.

What is claimed is:

1. A portable electronic apparatus comprising:
    a case;
    a display section accommodated in the case;
    a windshield that closes an opening section of the case in such a way that the windshield overlaps with the display section in a plan view;
    a ring member that is disposed between the windshield and the display section and along an outer edge of the display section;
    a hygroscopic member that is disposed inside the case and in a first region opposite the windshield with respect to the display section; and
    an air-flow channel that allows the first region to communicate with a second region surrounded by the display section, the windshield, and the ring member.

2. The portable electronic apparatus according to claim 1, wherein the air-flow channel includes a recessed section provided in a surface that forms the ring member and faces the display section and extending from an outer circumferential edge of the ring member to an inner circumferential edge thereof.

3. The portable electronic apparatus according to claim 1, wherein the air-flow channel includes a first hole that passes through the display section from a surface thereof facing the windshield to a surface thereof opposite the windshield-side surface.

4. The portable electronic apparatus according to claim 3, wherein the air-flow channel includes a second hole that faces the first hole and passes through the ring member from a surface thereof facing the windshield to a surface thereof facing the display section.

5. The portable electronic apparatus according to claim 1, wherein the air-flow channel includes a first recessed section that passes through the display section from a surface thereof facing the windshield to a surface thereof opposite the windshield-side surface and is recessed from an outer edge of the display section toward a center thereof.

6. The portable electronic apparatus according to claim 1, wherein the ring member has a protruding section that is located on a surface facing the display section and protrudes toward the display section, and
the air-flow channel includes a gap provided by the protruding section and located between the ring member and the display section.

7. The portable electronic apparatus according to claim 1, wherein the ring member is a parting plate.

* * * * *